US006933591B1

(12) United States Patent
Sidhu et al.

(10) Patent No.: US 6,933,591 B1
(45) Date of Patent: Aug. 23, 2005

(54) ELECTRICALLY-PROGRAMMABLE INTEGRATED CIRCUIT FUSES AND SENSING CIRCUITS

(75) Inventors: Lakhbeer S. Sidhu, San Jose, CA (US); Irfan Rahim, San Jose, CA (US)

(73) Assignee: Altera Corporation, San Jose, CA (US)

( * ) Notice: Subject to any disclaimer, the term of this patent is extended or adjusted under 35 U.S.C. 154(b) by 29 days.

(21) Appl. No.: 10/687,199

(22) Filed: Oct. 16, 2003

(51) Int. Cl.[7] ............................................. H01L 23/58
(52) U.S. Cl. ..................... 257/665; 257/529; 257/538; 257/530; 257/50; 257/209; 438/132; 438/215; 438/281; 438/333; 438/468
(58) Field of Search ............................. 257/529, 538, 257/530, 50, 209; 438/132, 215, 281, 333, 438/468

(56) References Cited

U.S. PATENT DOCUMENTS

| | | | |
|---|---|---|---|
| 5,444,287 A | | 8/1995 | Bezama et al. |
| 6,222,244 B1 | | 4/2001 | Arndt et al. |
| 6,242,790 B1 | * | 6/2001 | Tsui et al. ................. 257/529 |
| 6,368,902 B1 | | 4/2002 | Kothandaraman et al. |
| 6,512,284 B2 | * | 1/2003 | Schulte et al. ............. 257/530 |
| 6,624,499 B2 | * | 9/2003 | Kothandaraman et al. .. 257/529 |

OTHER PUBLICATIONS

C Kothandaraman, et al., "Electrically Programmable Fuse (eFUSE) Using Electromigration in Silicides," IEEE Electron Dev. Lett. vol. 23, No. 9, Sep. 2002, pp 523-525.

* cited by examiner

*Primary Examiner*—David Nelms
*Assistant Examiner*—Mai-Huong Tran
(74) *Attorney, Agent, or Firm*—G. Victor Treyz

(57) ABSTRACT

Programmable fuses for integrated circuits are provided. The fuses may be based on polysilicon or crystalline silicon fuse links coated with silicide or other conductive thin films. Fuses may be formed on silicon-on-insulator (SOI) substrates. A fuse may be blown by applying a programming current to the fuse link. The silicon or polysilicon in the fuses may be provided with a p-n junction. When a fuse is programmed, the silicide or other conductive film forms an open circuit. This forces current though the underlying p-n junction. Unlike conventional silicided polysilicon fuses, fuses with p-n junctions change their qualitative behavior when programmed. Unprogrammed fuses behave like resistors, while programmed fuses behave like diodes. The presence of the p-n junction allows sensing circuitry to determine in a highly accurate qualitative fashion whether a given fuse has been programmed.

27 Claims, 14 Drawing Sheets

ELECTRICALLY-PROGRAMMABLE INTEGRATED CIRCUIT FUSES AND SENSING CIRCUITS

BACKGROUND OF THE INVENTION

This invention relates to electrically-programmable integrated circuit fuses and sensing circuitry for such fuses.

Integrated circuit fuses are used in a variety of applications where configurable circuit elements are needed. For example, fuses may be used to adjust components such as variable resistor and may be used to implement redundancy schemes.

One type of fuse that has been developed uses a polysilicon link capped with a layer of silicide. When a fuse is unprogrammed, most current is conducted through the silicide layer, which has a lower resistance than the polysilicon. A fuse may be programmed by applying a programming current to form an open circuit in the silicide.

The increase in resistance that is produced when a fuse is blown may be sensed by circuitry on the integrated circuit. If the resistance is low, the fuse is considered to be unprogrammed. If the resistance is high, the fuse is considered to be programmed.

If the change in resistance of a fuse during programming is too small, it may be difficult to discern whether a given fuse has been programmed. Higher programming currents may be used to increase the resistance of the programmed fuses, but programming currents cannot be too high without damaging the integrated circuit and wasting power. Moreover, it is important for reliability that the location in the fuse link at which a fuse blows be repeatable.

It would be desirable to provide robust and sensitive integrated circuit fuses.

SUMMARY OF THE INVENTION

In accordance with the present invention, highly-sensitive integrated circuit fuses are provided. The integrated circuit fuses may be formed from polysilicon or crystalline silicon links capped with a layer of silicide or other conductive thin film.

A p-n junction may be formed in the silicon portion of a fuse. The p-n junction makes it possible to sense the state of the fuse using an extremely accurate qualitative approach, rather than the purely quantitative approach used to sense the state of conventional polysilicon fuses.

To program a fuse with a p-n junction, a programming current is applied to the fuse. The programming current blows the fuse by creating an open circuit in the silicide or other conductive layer on top of the polysilicon (or silicon). Once the conductive layer is blown, the diode-like electrical character of the underlying polysilicon or silicon layer with the p-n junction will dominate the behavior of the fuse.

With this arrangement, the fuse's state may be sensed by examining the fuse to determine whether it is behaving like a resistor (i.e., the fuse is in an unprogrammed state) or whether the fuse is behaving like a diode (i.e., the fuse is in its programmed state). It is much easier to sense this qualitative change in the fuse's characteristics than it is to attempt to quantitatively sense a change in the magnitude of a fuse's resistance as done with conventional fuses. As a result, the sensing circuitry used to determine the state of the p-n junction fuses can more accurately determine whether a given fuse has been programmed or not.

The presence of the p-n junction in the underlying link makes it possible to detect that a fuse has been programmed, even if the conductive layer has only been partially blown. Small, previously undetectable amounts of conductive layer removal will still result in measurable qualitative changes in the fuse's characteristics. This makes it possible to significantly reduce the amount of energy used to program the p-n junction fuses as compared to conventional silicided polysilicon fuses which do not have p-n junctions.

If desired, the performance of the fuses may be further enhanced by using heat sink structures to create thermal gradients in the fuse links during programming. Current-crowding structures such as narrowed conductive-layer regions or fuse link bends may also be used. The heat sinks and current-crowding arrangements may help to ensure that the silicide or other conductive layer fails directly above the p-n junction in the underlying silicon or polysilicon, thereby guaranteeing that the sensitive p-n junction sensing technique can be used to detect the state of the fuses.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to integrated circuits having programmable fuse circuitry. The invention also relates to programmable fuses and sensing circuitry for sensing the states of the fuses.

Electrically-programmable fuses are used in a variety of integrated circuits. For example, electrically-programmable fuses may be used to configure the logic of a programmable logic device. Electrically-programmable fuses may also be used to implement redundancy schemes or to set the values of adjustable resistors or other circuit components. If desired, electrically-programmable fuses may be used for non-volatile information storage (e.g., to store a serial number or other information on a chip).

Figure 1:
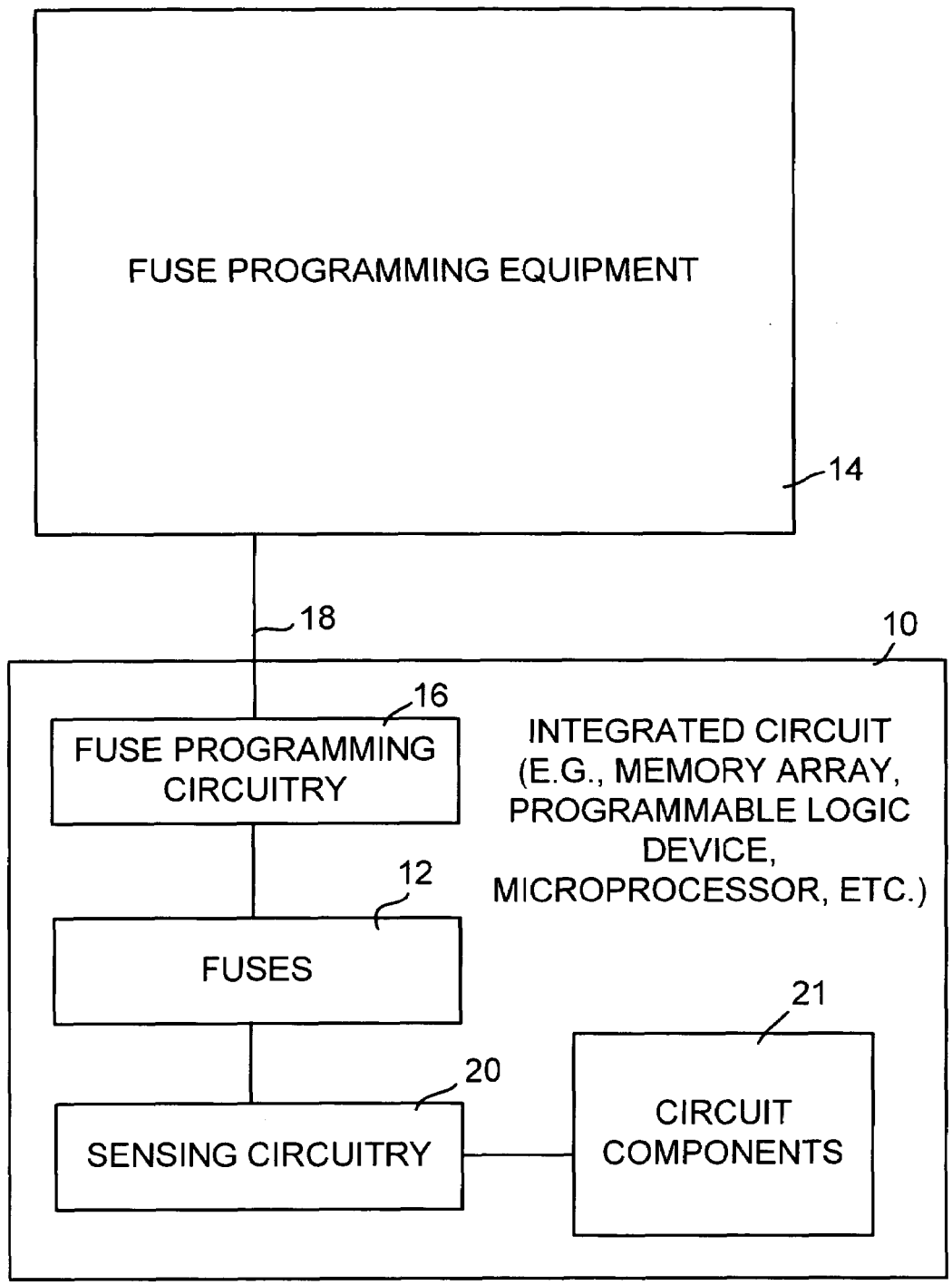
FIG. 1 is a diagram showing how fuse programming equipment may be used to electrically program fuses on an integrated circuit in accordance with the present invention.

An illustrative integrated circuit 10 containing electrically-programmable fuses 12 is shown in FIG. 1. Integrated circuit 10 may be any suitable integrated circuit, such as an application-specific integrated circuit, a programmable logic device, a microprocessor, a digital signal processor, memory device, an analog integrated circuit, etc.

Fuses 12 are initially conductive (i.e., in their "unprogrammed" state). After programming, the fuses are considered "blown" and are essentially no longer conductive (i.e., they form an open circuit).

Fuses 12 can be programmed using fuse programming equipment 14. Equipment 14 may be part of the equipment in a manufacturing line, equipment associated with a party who is testing or customizing the integrated circuit, or equipment associated with any other suitable user.

Fuses 12 can be programmed to store data on an integrated circuit, to adjust components on the circuit, to program logic on the integrated circuit so that it performs desired custom logic functions, etc.

With one suitable arrangement, fuse programming equipment 14 may be used during the manufacturing process to implement a redundancy scheme. With this type of approach, circuit 10 is originally designed to include redundant or spare circuitry. In a memory chip or a programmable logic device, for example, an extra column of spare circuitry may be formed when the integrated circuit die is fabricated. Each die that is fabricated may be tested for defects. If a defect is located, the spare circuitry (e.g., the extra column of circuitry) may be switched into use in place of the defective circuit (e.g., the column of circuitry in which the fault was located).

When using redundancy in an integrated circuit design, it is desirable to avoid imposing extra burdens on downstream users due to the use of redundancy. Rather, the repaired integrated circuits should appear to the users of the circuits as though they are perfect and have never been repaired. It is therefore desirable to use non-volatile storage devices such as electrically-programmable fuses 12 to configure the switches used to switch the redundant circuitry into use. Once programmed, the fuses 12 hold their state indefinitely, so that the integrated circuit is permanently repaired.

The non-volatile nature of fuses 12 may also be desirable when programming logic on a programmable logic device or when adjusting the value of an adjustable component such as a resistor.

Fuses 12 may be programmed directly (e.g., by using equipment 14 to apply a programming current in excess of a fuse's maximum current-handling capacity to each fuse to be programmed) or indirectly (e.g., by informing on-chip circuitry of which fuses need to be programmed). Generally, at least some on-chip fuse programming circuitry 16 is used to assist in the programming of fuses 12. Fuse programming circuitry 16 may include current drivers and other suitable circuitry for applying a programming current to each fuse 12 that is to be programmed.

The fuse programming circuitry 16 may, if desired, be responsive to digital programming data supplied by external equipment through an input/output pin such as pin 18. For example, fuse programming equipment 14 may be used to load configuration data (programming bits) into integrated circuit 10. The fuse programming circuitry 16 may respond to the pattern of configuration bits that have been supplied by equipment 14 by applying a programming current to the appropriate fuses 12 on circuit 10. The programming current will then blow these fuses.

Integrated circuit 10 may include sensing circuitry 20 for sensing which fuses have been programmed and which fuses are still in their unprogrammed state. The output from the sensing circuitry 20 may be provided to circuit components 21. As an example, the sensing circuitry may include circuitry for determining whether the resistance of a given fuse is high or low. If the resistance is low, the sensing circuitry 20 can generate a corresponding control signal at a high logic level. If the resistance is high, the sensing circuitry 20 can generate a corresponding control signal at a low logic level.

Each control signal from the sensing circuitry 20 may be used to control the operation of a transistor or other device within circuit components 21. Components 21 may include any suitable electrical components such as metal-oxidesemiconductor transistors and components formed from such transistors (e.g., logic gates, switches, multiplexers, adjustable resistors and other components, etc.).

Figure 2:
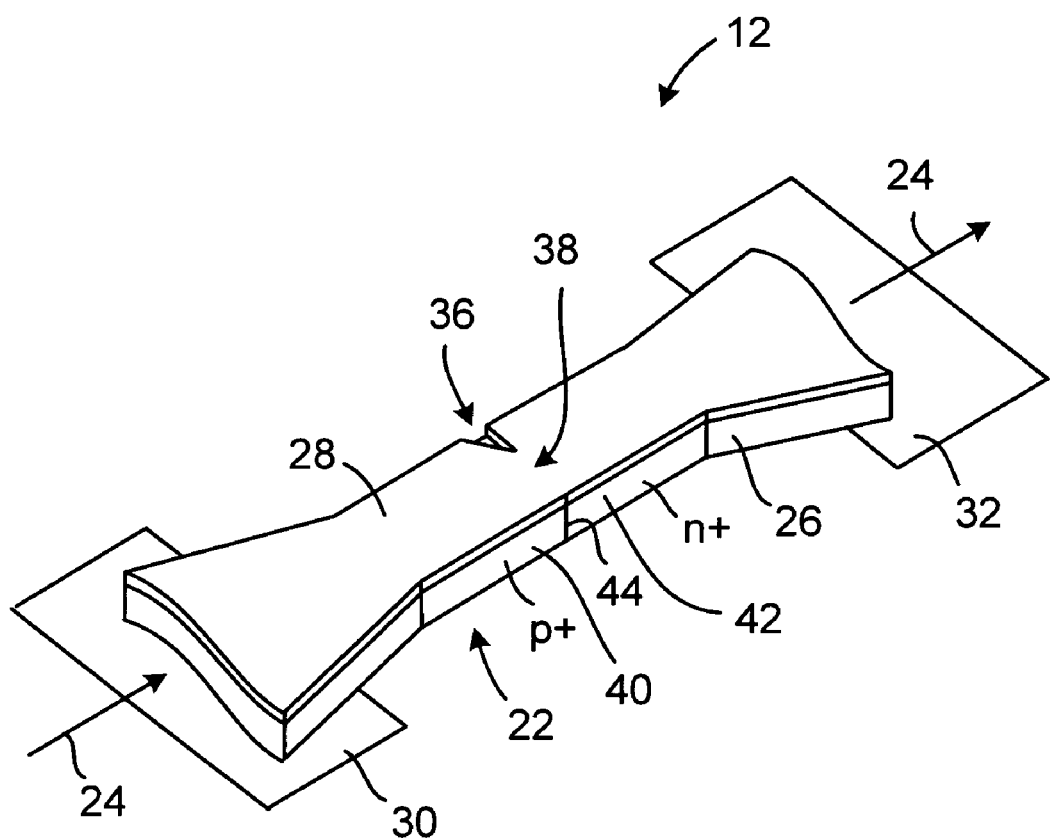
FIG. 2 is a somewhat-generalized perspective view of an illustrative electrically-programmable integrated circuit fuse in accordance with the present invention.

An illustrative electrically-programmable fuse 12 in accordance with the present invention is shown in FIG. 2. Fuse 12 is formed from a fusible link 22 having a semiconductor 26 coated with a conductive thin film 28. Links such as link 22 may be formed from silicided polysilicon, polysilicon coated with other conductive thin films (e.g., metals or other conductors), from crystalline silicon (e.g., crystalline silicon that is coated with silicide or other suitable conductive thin film and that is isolated by insulating structures such as shallow trench isolation and buried oxide layers on an silicon-on-insulator substrate, other semiconductor and conductive thin film structures, etc. For clarity, the invention will generally be described in the context of silicided polysilicon fuse links. This is, however, merely illustrative. Any suitable materials system may be used to construct fuse links 22 for fuses 12 if desired.

As shown by arrows 24 in FIG. 2, current flows along the longitudinal axis of link 22. By applying a sufficiently high current to fuse 12, fuse 12 can be blown. Once blown, the resistance of fuse 12 increases substantially, so that the fuse 12 can be considered to be "programmed."

With the illustrative configuration of FIG. 2, link 22 has an underlying layer of polysilicon 26 that is covered with a layer of silicide 28. The arrangement of FIG. 2 is compatible with commonly-used semiconductor fabrication processes. With such standard fabrication processes, transistor gates and other structures such as short interconnects are formed from polysilicon. The polysilicon in these structures is generally capped with silicide to reduce its resistance.

Links 22 with polysilicon capped with silicide are attractive for fuses 12 because these links will be compatible with standard fabrication processes, but other systems can be used if desired. For example, if a metal or other conductive capping layer is being used in a given integrated circuit in place of silicide, then it may be advantageous to form links 22 using that material instead of silicide. Similarly, if another underlying material layer is used in place of polysilicon (e.g., crystalline silicon), that material can be used as part of link 22 and fuse 12. For clarity, the present invention is described primarily in the context of fuses formed from polysilicon and silicide. This is, however, merely illustrative. Any suitable materials system may be used for form fuses 12 if desired.

The polysilicon portion of link 22 generally has a relatively high resistivity compared to silicide layer 28, so most current is carried by the silicide layer 28. Before programming, the silicide layer 28 is intact and conducts current. After programming, the layer 28 becomes an open circuit. The open circuit results from agglomeration and/or electromigration in the silicide layer due to the application of the programming current. The only structure left to conduct current after programming is the higher-resistivity polysilicon, so the fuse effectively no longer conducts once the silicide layer has been blown.

The polysilicon layer 26 may be on the order of a few thousand angstroms thick (e.g., 0.2 microns thick) and may be formed using any suitable deposition process such as thermal decomposition of silane followed by an anneal.

Silicide 28 may be hundreds of angstroms thick or less (e.g., 0.1 micron thick). Silicide 28 may be deposited by any suitable deposition technique such as chemical vapor deposition (CVD) using organometallic precursors. Silicide 28 may be, for example, cobalt silicide, nickel silicide, titanium silicide, etc.

Fuses 12 may have heat sinks such as heat sinks 30 and 32. The heat sinks remove heat from link 22 that is generated by the programming current. In the illustrative configuration of FIG. 2, the heat sinks 30 and 32 remove heat from the ends of link 22. Using heat sinks such as heat sinks 30 and 32 may help to establish thermal gradients across the link 22 when current is being applied to the link. These thermal gradients can help to blow the link.

Fuses 12 may also be configured to crowd the current that is flowing through the silicide when current is being applied to a fuse to blow the link. One way in which to crowd the current through the silicide layer 28 is to include a notch 36 or other narrowing structure in the silicide. As current approaches the notch, it is forced to flow through the unnotched portion 38 of the remaining silicide. This causes an increase in the local current density in portion 38 and enhances the stresses on portion 38. The silicide 28 is therefore most likely to blow in region 38.

Current-crowding structures such as notch 36 may be used in fuses 12 with or without heat sinks such as heat sinks 30 and 32. An advantage of using both current-crowing structures and heat sinks together is that the combined effect of these two approaches in localizing the silicide break during programming may be significant.

If desired, the fuse 12 may have a p-n junction in the polysilicon 26. For example, ion-implantation or other suitable doping techniques may be used to form a p+p-type doping region 40 and an n+n-type doping region 42 in the polysilicon 26, which form a p-n junction 44. The p-n junction forms a diode. When current is being applied in the reverse direction, (i.e., through the junction 44 from the n-type region 42 to the p-type region 44, the junction 44 tends to block the flow of current). This increases the effective resistance of this portion of polysilicon portion of link 22.

By configuring the link 22 properly (e.g., by appropriate use of heat sinks and/or current crowding effects) application of the programming current will cause an increase in silicide resistance (an open circuit) in the vicinity of junction 44. Because bypass current through the polysilicon layer 26 is effectively blocked by the reverse-bias junction, the junction 44 has the effect of increasing the programmed resistance of the link in the reverse-bias direction.

Moreover, the ratio of forward to reverse current may be sensed by sensing circuitry 20 (FIG. 1) to help confirm fuse programming. When the fuse is unprogrammed, significant current passes through the silicide layer 28, which has an ohmic character, so the ratio of the forward-to-reverse current is relatively low. When the fuse is programmed and there is a break in the silicide in the vicinity of the p-n junction, current is forced to flow through the junction. In this situation, the forward current is much higher than the reverse current, due to the rectifying properties of the polysilicon p-n junction. The sensing circuitry 20 (FIG. 1) can use this high ratio of forward to reverse current to establish that the fuse has been blown.

If desired, the polysilicon p-n junction may be used in fuses that do not have current-crowding structures, heat sink structures, or other such structures for localizing the silicide failure site during programming. However, use of such localization structures may help to ensure that the p-n junction is forced into the current path through the blown fuse. Fuses without break-localization structures may be more susceptible to silicide agglomeration and/or electromigration causing an open circuit in the silicide portion of link 22 that is not immediately adjacent to the p-n junction, thereby allowing a reverse-bias bypass current path to develop through the polysilicon that is not blocked by the reverse-biased p-n junction.

Figure 3:
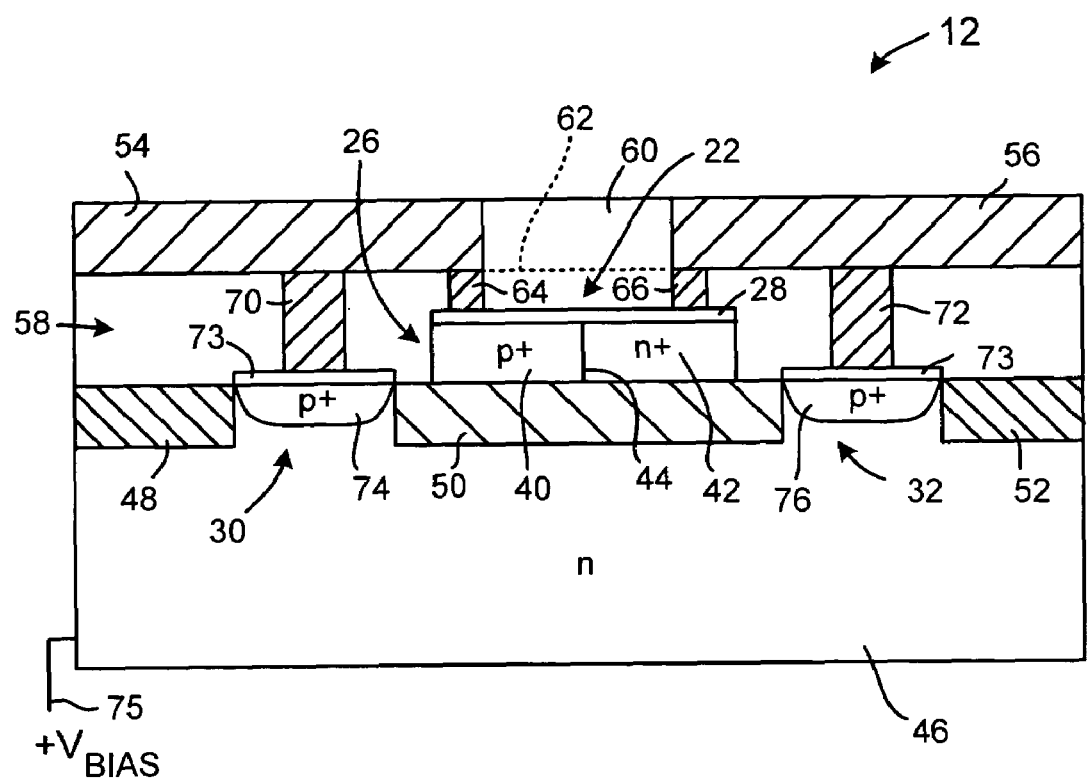
FIG. 3 is a cross-sectional view (not to scale) of an illustrative electrically-programmable integrated circuit fuse in accordance with the present invention.

A cross-sectional side view of an illustrative fuse 12 having heat sink structures 30 and 32 and a fuse link 22 with a p-n junction 40 separating a p-type polysilicon region 40 from an n-type polysilicon region 44 is shown in FIG. 3. The structure of FIG. 3 may be formed on a silicon wafer or other suitable substrate. The lower portion of the substrate may have any suitable doping or may be undoped. The upper portion of the substrate 46 that is shown in FIG. 3 may be doped. In the example of FIG. 3, substrate region 46 is doped n-type.

Shallow trench isolation (STI) structures may be formed in substrate 46. Such structures may be fabricated by forming a trench, filing the trench with silicon oxide, and planarizing. Such structures are readily available with standard semiconductor fabrication processes. In the example of FIG. 3, shallow trench isolation regions 48, 50, and 52 are formed in the vicinity of fuse 12.

The oxide of the shallow trench isolation regions 48, 50, and 52 forms a thermal and electrical barrier. Current cannot be conducted through regions 48, 50, and 52, because silicon oxide is not electrically conductive. Moreover, the thermal conductivity of silicon oxide is very poor when compared to that of silicon. As a result, the silicon opening formed between STI region 48 and STI region 50 serves as a heat sink 30 and the silicon opening between STI region 40 and STI region 52 serves as heat sink 32. The heat sinks 30 and 32 conduct heat from the link 22 downwards into the silicon substrate, where the heat is dissipated into the bulk silicon of the integrated circuit and through the integrated circuit's external package and heat sink (if used).

Current is applied to the fuse 12 through conductive interconnects 54 and 56. These interconnects (also called metal lines, conductive lines, conductive or metal electrodes, etc.) may be used to electrically connect the two ends of fuse 12 to the fuse programming circuitry 16 (FIG. 1) and sensing circuitry 20 (FIG. 1). With the illustrative arrangement shown in FIG. 3, the metal lines 54 and 56 are formed in the first layer of metal (M1) on the integrated circuit and are insulated from the underlying portions of the circuit by a dielectric layer 58. Dielectric layer 58 (which may sometimes be called the interlayer dielectric or ILD) may be formed from any suitable insulating dielectric (e.g., silicon oxide, etc.).

Metal lines 54 and 56 may (as an example) be formed from trenches in a dielectric layer 60 (which may sometimes be called the intermetal dielectric or IMD) using a damascene process. The boundary between dielectric layer 60 and dielectric layer 58 is shown by dotted line 62. The dielectric layers 58 and 60 are thermally and electrically insulating. Subsequent layers of dielectric and metal are generally formed on the circuit during the complete fabrication process, but such layers are not shown in FIG. 3 to avoid over-complicating the drawing.

Metal lines 54 and 56 form electrical contacts with each end of the silicide layer 28 through metal-filled vias 64 and 66. There may be more than one via used at each end of the fuse, to reduce the contact resistance between metal lines 54 and 56 and the silicide, thereby avoiding undue heating (and potential silicide failure) in the vicinity of the metal-to-silicide contacts.

During programming, the programming current applied to the fuse flows through the silicide layer 28 and, generally to a lesser degree, through the underlying polysilicon layer 26 (formed from p and n regions 40 and 42 in the illustrative arrangement of FIG. 3). The current flow through the silicide leads to ohmic heating of the silicide. The heat produced in the silicide is laterally confined due to surrounding portions of thermally-insulating dielectric layer 58 and is vertically confined due to the underlying STI region 50 and the overlying portions of layers 58 and 60.

Metal is a good thermal conductor, however, so the heat produced in silicide 28 and polysilicon 26 is conducted through vias 64 and 66 into lines 54 and 56 respectively.

The heat sinks 30 and 32 include metal portions that provide a high-thermal-conductivity path between lines 54 and 56 and the underlying silicon of substrate 46. In the example of FIG. 3, heat sink 30 has a metal-filed hole 70 (called a "contact") that conducts heat from line 54 to substrate 46. Heat sink 32 has a contact 72 that conducts heat from line 56 to substrate 46. When the fuse is being programmed, heat flows up through via 64, along metal line 54, and down through contact 70 into silicon 46. Similarly, heat flows up through via 66, along line 56, and down though contact 72 to silicon 46. The heat sinks 30 and 32 therefore tend to lower the temperature of the fuse at its ends relative to the temperature in the middle of the fuse in the vicinity of junction 44. The heat and the thermal gradients established in silicide 28 and polysilicon 26 help to open circuit the silicide and program the fuse 12.

During programming, a voltage is applied across the fuse 12. The voltage across fuse 12 could cause an undesirable bypass current to flow through substrate 46 instead of fuse 12, unless this path is blocked. Because a substrate bypass current would reduce the efficiency of the fuse programming process, current flow through the substrate 46 is preferably blocked.

Any suitable arrangement may be used to block the current flow between contacts 70 and 72 through substrate 46 while still allowing the heat to flow from contacts 70 and 72 into substrate 46. In the illustrative arrangement shown in FIG. 3, heavily-doped p+ wells 74 and 76 are formed under each contact. Wells 74 and 76 may be coated with a layer of silicide 73 if desired. The p+ wells 74 and 76 may be formed during the same process steps (e.g., ion implantation and annealing steps) that are used to form source and drain regions elsewhere on the integrated circuit. The p-type doping of wells 74 and 76 forms two back-to-back diodes with the n-type substrate 46. The n-type substrate 46 may be biased relative to the p-type wells 74 and 76 to help ensure that the back-to-back diodes are reversed biased (shown schematically as the voltage $V_{BIAS}$ being applied to substrate 46 at bias connection 75 in FIG. 3). With this arrangement, current is prevented from traveling from contact 70 to contact 72 through the substrate.

Because the p-type doped regions 74 and 76 are formed from silicon, they (and their optional silicide layers 73) have a high thermal conductivity. The presence of these regions is therefore effective at blocking bypass current through the substrate without adversely affecting the heat conduction properties of the heat sinks 30 and 32. In the example of FIG. 3, the heavily doped regions 74 and 76 have a p-type doping, whereas the adjacent portion of substrate 46 has an n-type doping. This is merely illustrative. For example, substrate 46 could be doped p-type and the regions 74 and 76 that lie directly under the contacts 70 and 72 could be doped n-type. This arrangement would still produce two opposing diodes and would still block the bypass current flow through the substrate during fuse programming.

Figure 4:
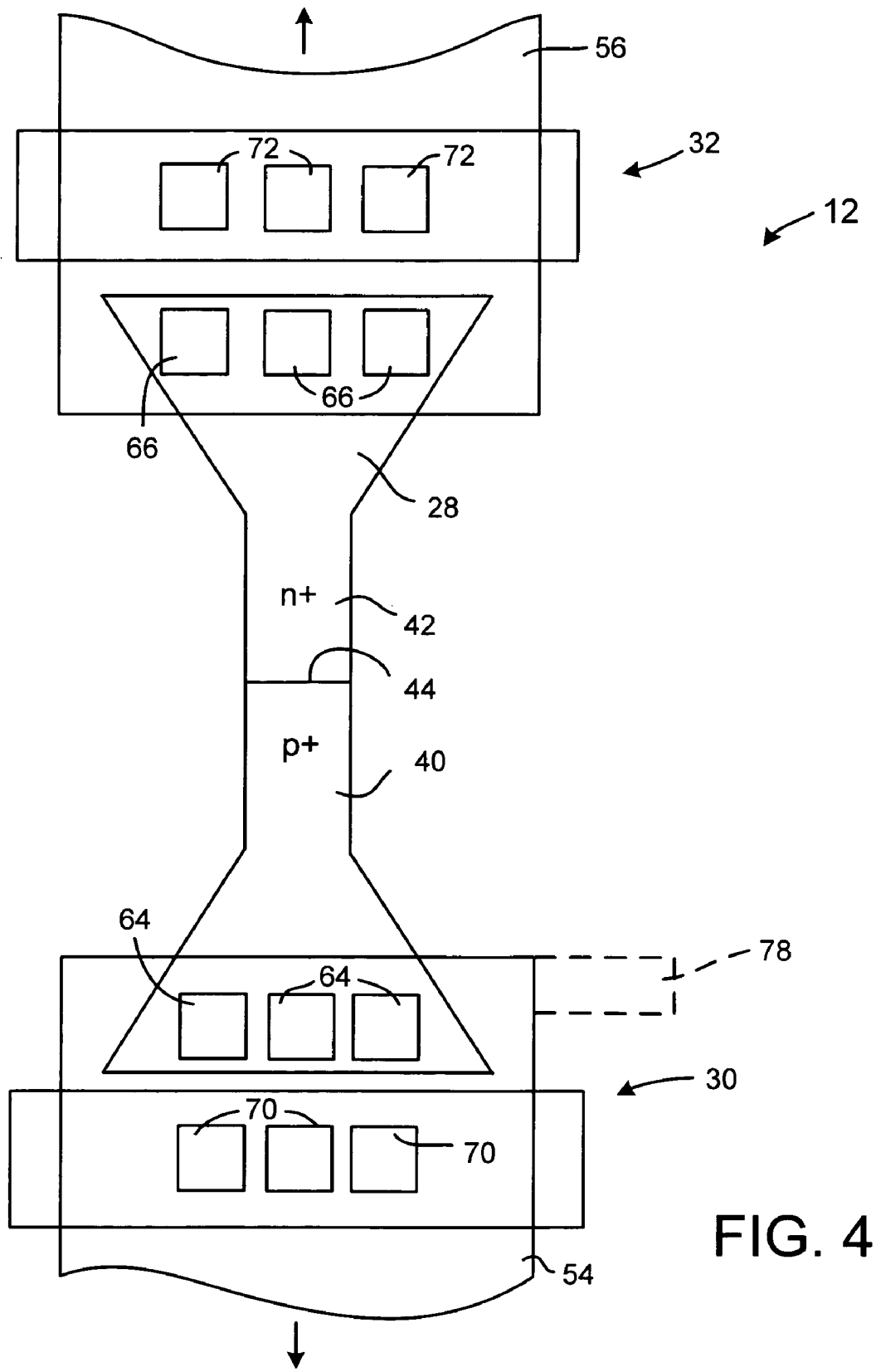
FIG. 4 is a top view (not to scale) of an illustrative electrically-programmable integrated circuit fuse in accordance with the present invention.

A top view of the fuse 12 of FIG. 3 is shown in FIG. 4. As shown in FIG. 4, there may be a plurality of via holes 64 and 66 at either end of the fuse 12 to electrically and thermally connect the metal lines 54 and 56 with the underlying upper surface of silicide 28. Multiple contacts 70 and 72 may be provided to thermally connect the metal lines 54 and 56 with the underlying silicon substrate 46 (see FIG. 3). In the illustrative arrangement of FIG. 4, the via and contact holes are provided in groups of three. This is merely illustrative. If desired, a single hole may be used at each location, different numbers of holes may be used at each location, the holes may have different sizes and shapes, etc.

Moreover, other thermal and electrical path arrangements may be used for conveying current through the silicide to blow the fuse that are also suitable for removing heat (when heat sinks are desired). As an example, a laterally extending metal branch portion may extend off of line 54 or 56, as shown by dotted line 78. This metal branch (which need not be rectilinear or oriented at right angles with respect to lines 54 and 56) may be used to conduct current to fuse 12 during programming and/or may be used as part of a thermally-conductive path for removing heat.

The heat removal paths for fuse 12 (when fuse 12 uses heat sinks) need not share the electrical paths through fuse 12. As an example, current could be conducted straight through the fuse using conductive lines 54 and 56, while the heat removal paths could be located under a branch conductor such as a branch conductive metal line located where shown by dotted line 78.

Any suitable dimensions may be used for the structures of FIGS. 3 and 4. In a typical fuse 12, the widths of the silicide/polysilicon links such as link 22 may be as small as permitted by the design rule of the semiconductor fabrication process being used to form the integrated circuit 10. This may be, for example, 0.15 microns, 0.13 microns or less. Wider links 22 may also be used.

The length of a typical link 22 (i.e., the cumulative distance along a link 22 between metal line 54 and metal line 56) may be about 2 microns (e.g., 1.5–2.5 microns), less than 2.5 microns, or any other suitable length. The openings on the surface of the substrate for heat sinks 30 and 32 may be about 1×3 microns (as an example) and metal lines 56 and 54 may be about 2 microns wide (as an example). The ends of the silicide/polysilicon link 22 may be flared to larger widths (e.g., one micron) than are used in their narrower (e.g., 0.15 microns) central region. Flaring or otherwise enlarging the ends of the silicide and polysilicon fuse structures may help these structures make good ohmic contacts to the overlying metal lines 54 and 56 through multiple vias 64 and 66.

These are merely illustrative dimensions for fuses 12. Any suitable dimensions may be used for fuses 12 depending on the fabrication process being used to fabricate integrated circuit 10 and depending on the needs of the user of the fuses.

As described in connection with FIGS. 2–4, heat sinks may be used to draw heat from the fuse link 22. The use of heat sinks establishes thermal gradients in the silicide/polysilicon link 22 that help to blow the link during programming. Any suitable number of heat sinks may be used in a fuse 12 (e.g., no heat sinks, one heat sink, two heat sinks, three heat sinks, or more than three heat sinks, structures that serve both heat-sink and non-heat-sink purposes, etc.).

Figure 5:
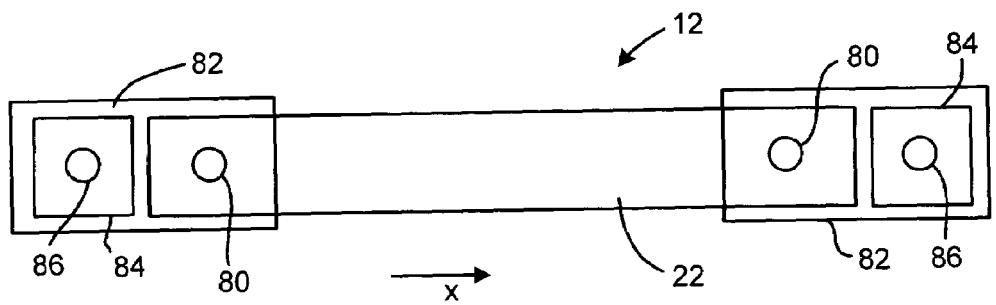
FIG. 5 is a top view of an illustrative electrically-programmable integrated circuit fuse showing how heat sinks can be provided at either end of the fuse's polysilicon link in accordance with the present invention.

A top view of an illustrative fuse 12 with a heat sink at either end of its silicide/polysilicon link 22 is shown in FIG. 5. During programming, link 22 produces heat. The heat may be extracted in the upwards direction (out of the page) by metal-filled via holes 80, conveyed horizontally (in the plane of the page) along metal portions 82, and then conveyed downwardly (into the page) to silicon heat sink region 84 through metal-filed contact holes 86.

Figure 6:
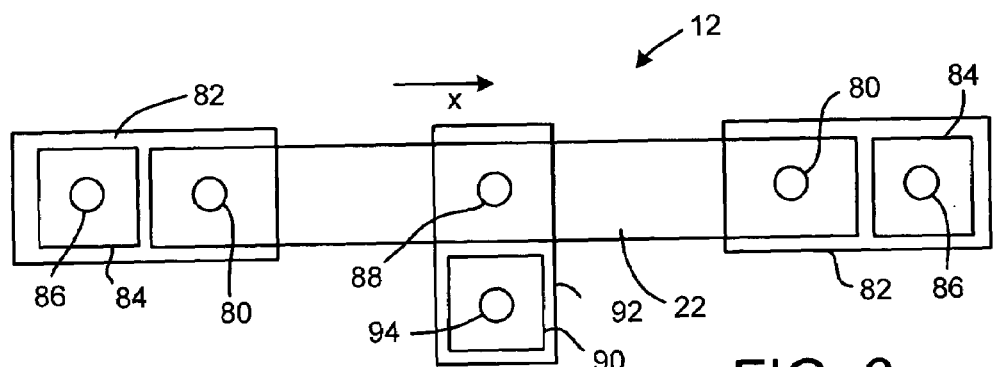
FIGS. 6 and 7 are top views of illustrative electrically-programmable integrated circuit fuses showing how heat sinks can be provided at either end of the fuse's polysilicon link and in the middle of the link in accordance with the present invention.

A top view of an illustrative fuse 12 with a heat sink at either end and with an additional centrally-located heat sink is shown in FIG. 6. With the arrangement of FIG. 6, heat in the middle of link 22 is extracted upwardly (out of the page) through metal-filed via 88 and is conveyed into the silicon substrate of heat sink region 90 via metal portion 92 and contact 94.

The fuse 12 of FIG. 6 uses a branch metal portion 92 that extends to a substrate heat sink 90 on one side of link 22. If desired, an arrangement of the type shown in FIG. 7 may be used, where there are heat sinks 90 on either side of link 22. The arrangement of FIG. 6 consumes more real estate, but the extra heat sink region 90 provides more effective heat removal than the single-sided structure of FIG. 6.

Figure 8:
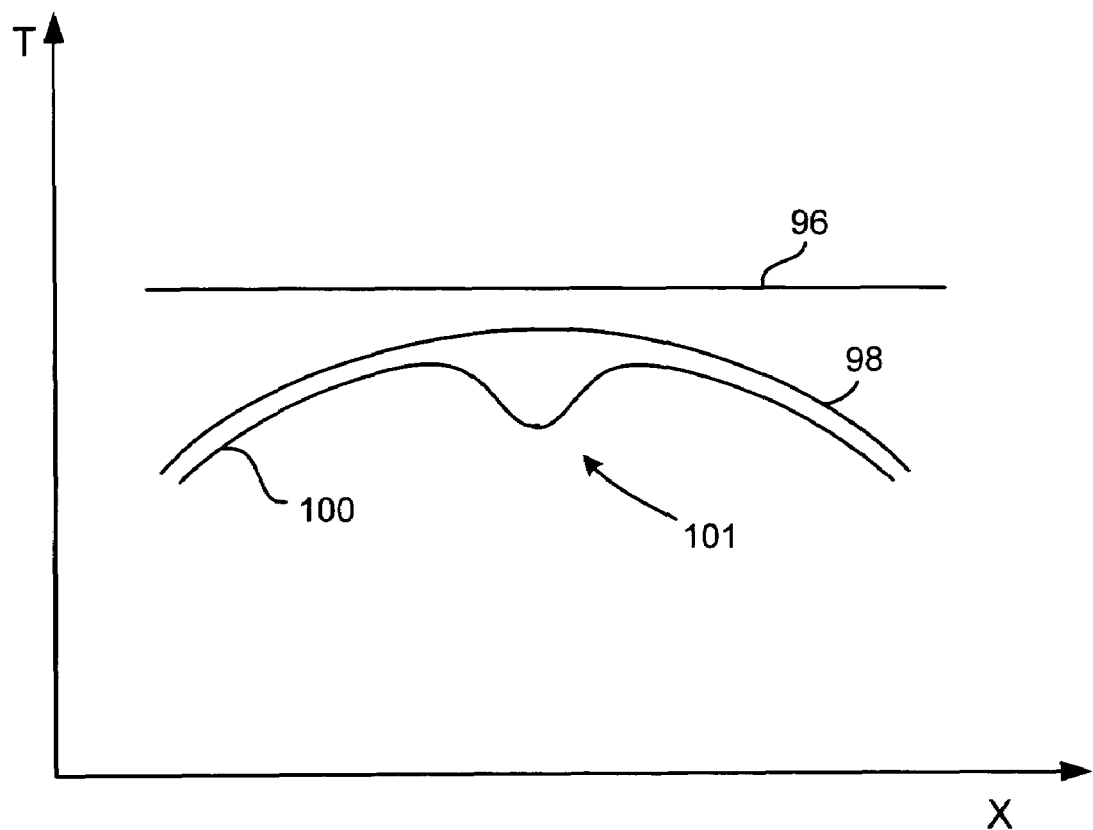
FIG. 8 is a graph showing temperature profiles for various illustrative polysilicon fuse links without heat sinks and with heat sinks in accordance with the present invention.

If no heat sinks are used in link 22 (i.e., if the electrical lines leading to the ends of link 22 are well insulated from the silicon substrate and other potential heat sink structures, the link 22 may develop a fairly flat thermal profile along its length such as profile 96 of FIG. 8.

When a heat sink is provided at either end of the link, as with a structure of the type shown in FIG. 5, the link may develop a thermal profile with significant gradients, such as thermal profile 98. As shown by the downward-sloping ends of profile 98, the temperature of the silicide/polysilicon link 22 in the vicinity of heat sinks 84 is less than the temperature in the center of the link 22.

Figure 7:
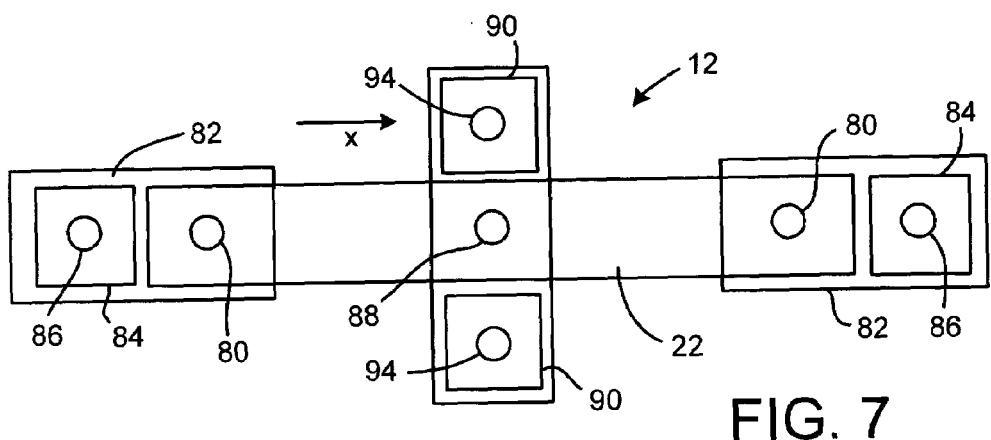

When a heat sink arrangement of the type shown in FIG. 7 or FIG. 8 is used, link 22 may develop a thermal profile along its longitudinal axis such as profile 100 of FIG. 8. Central region 101 of profile 100 exhibits a temperature reduction due to the use of the central heat sink region 90.

The arrangements of FIGS. 5–8 are merely illustrative. Any suitable heat sink structure may be used in fuse 12 if desired. The thermal gradients that are established in the silicide/polysilicon link portion of the fuse as a result of using the heat sinks help to blow the link during programming (e.g., due to thermally-induced stresses). Because the heat sinks are placed at known locations, the resulting localization of the weak point of the link 22 helps to define where the link 22 will develop its open circuit when programmed. The use of heat sinking is therefore an example of a suitable technique for localizing the failure of the silicide at a particular position within link 22.

Another suitable localization technique that may be used involves current crowding. When current through the silicide portion of a fuse link is crowded, the local current density rises. This leads to elevated temperatures and carrier densities and helps to blow the fuse.

Figure 9:
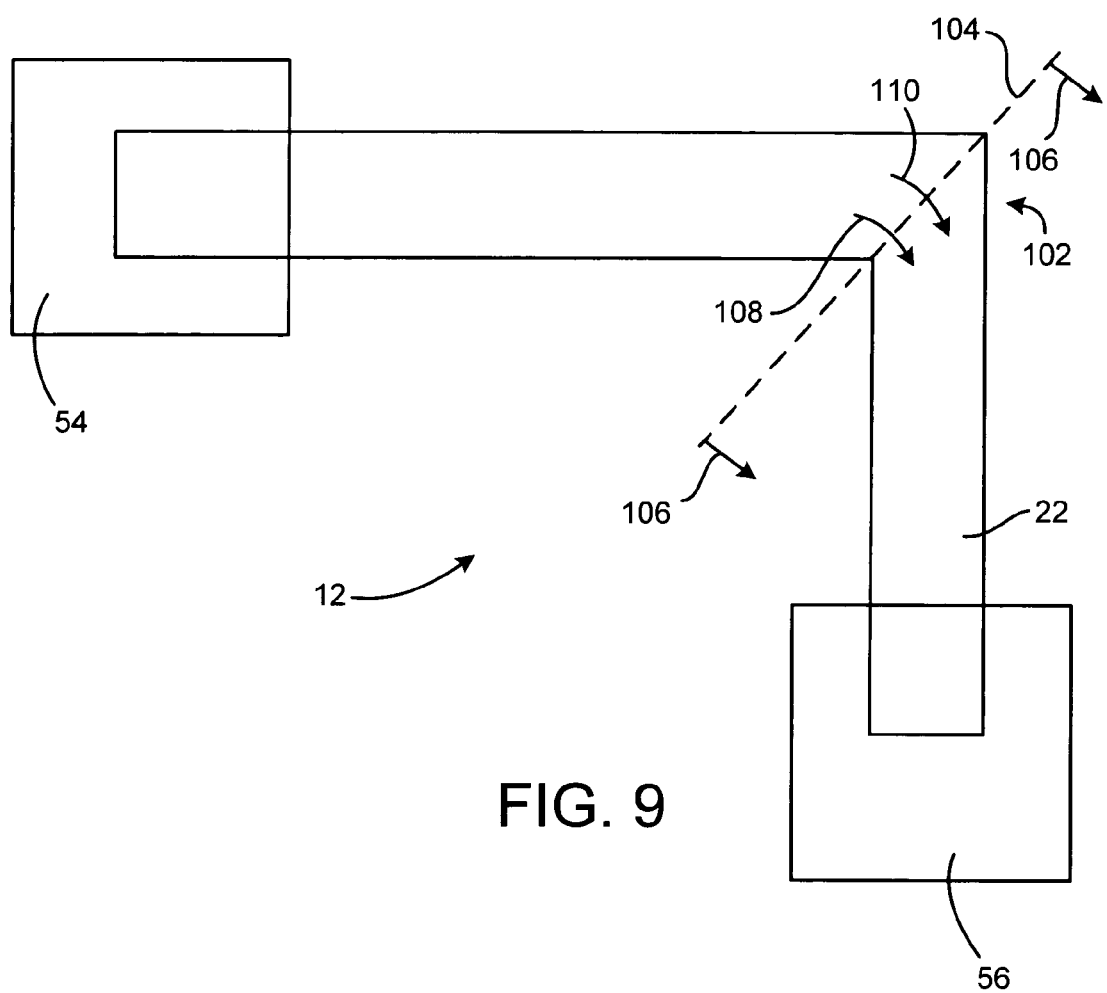
FIG. 9 is a top view of an illustrative electrically-programmable integrated circuit fuse showing how a polysilicon fuse link may have a bent portion in accordance with the present invention.

An illustrative link arrangement that may assist in crowding the programming current and that may therefore help to specify the location in the link where the link will blow is shown in FIG. 9. With the arrangement of FIG. 9, link 22 has a bend 102. The position of the bend in link 22 localizes the highest current density during programming and helps to define the location at which the silicide in the link 22 will blow. The bend of FIG. 9 is a 90° (right-angle) bend, but link 22 can use a bend at another angle (e.g., 45°, etc.) if desired.

Figure 10:
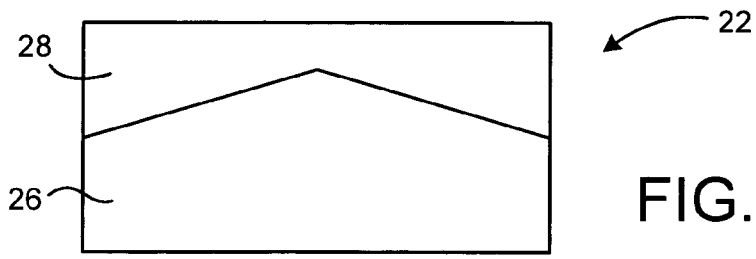
FIG. 10 is a cross-sectional view of an illustrative silicided polysilicon link for an electrically-programmable integrated circuit fuse in accordance with the present invention.

A cross-sectional view of a typical silicide/polysilicon link 22 of FIG. 9 taken in direction 106 along dotted line 104 is shown in FIG. 10. As shown in FIG. 10, with commonly-available silicide/polysilicon integrated circuit fabrication techniques, there can be a thickening of silicide layer 28 near the edges of link 22. As a result of this thickening and as a result of the shape of bend 102, the programming current traveling from metal line 54 to metal line 56 initially tends to concentrate along path 108. Because the current is not distributed equally throughout the cross-sectional area of link 22, the current is said to be "crowded." One result of this current crowding effect is that it raises the local current density and localizes the silicide failure position.

As the silicide in the vicinity of path 108 starts to fail, this portion of link 22 becomes more resistive than adjoining portions of silicide 26. Current will therefore flow through path 110, rather than path 108. This process continues, until the entire link has been electrically severed along line 106. Because the bend 102 is formed at a known, regular location along link 22, the current crowding produced by bend 102 serves to localize the fuse rupture location. This makes the fuse blowing process more stable and repeatable.

Another suitable current-crowding structure that may be used to localize the position in the fuse link 22 at which programming occurs uses width reduction in silicide layer 28. Any suitable width-reduction technique may be used to locally narrow a portion of the silicide of link 22. An illustrative fuse 12 having a silicide layer 28 that has been narrowed with a notch 36 is shown in FIG. 1.

Figure 11:
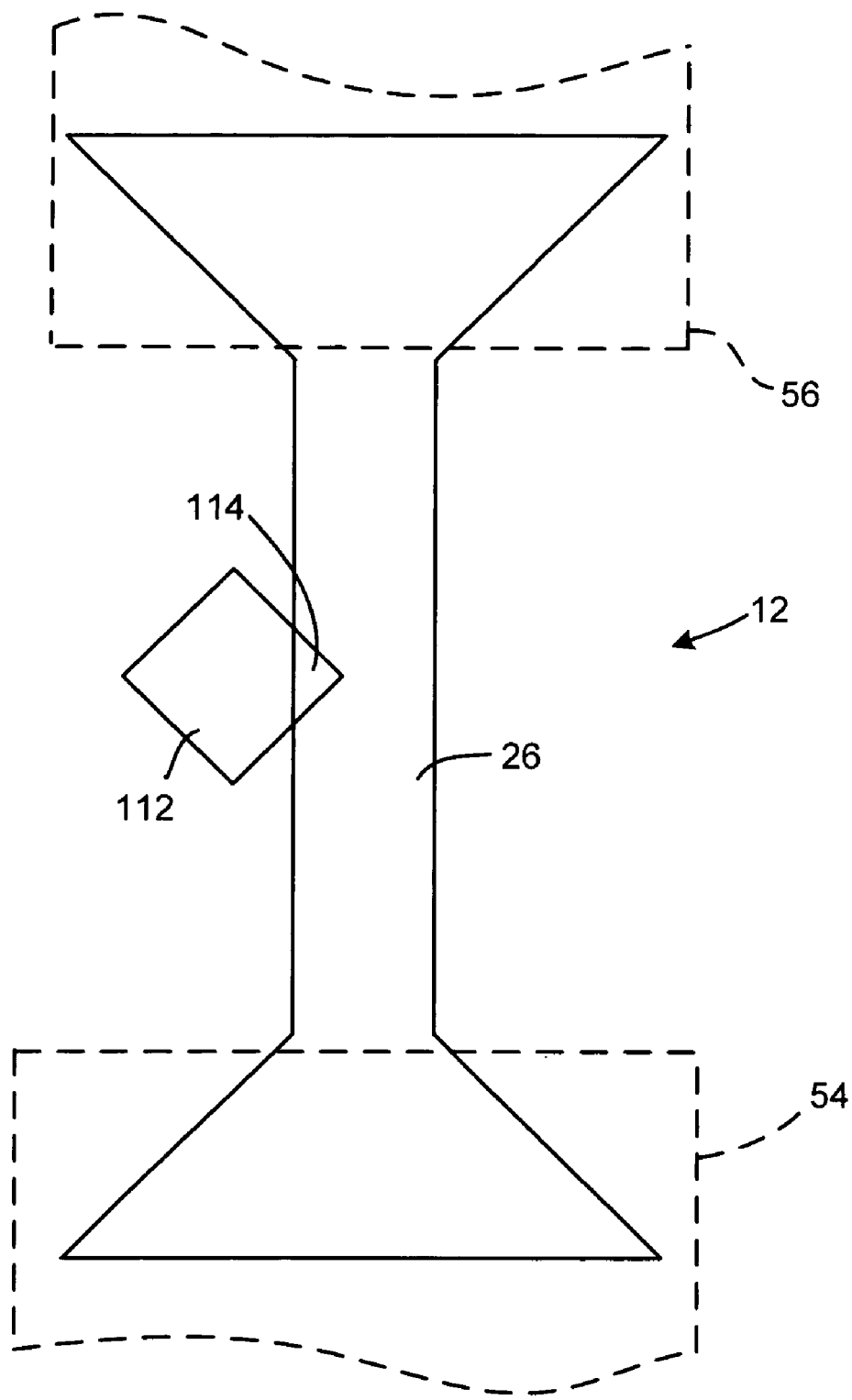
FIG. 11 is a top view of an illustrative polysilicon link for an electrically-programmable integrated circuit fuse showing how patterned photoresist may be used to narrow a surface silicide layer on the polysilicon link in accordance with the present invention.

Notches such as notch 36 may be formed using any suitable semiconductor fabrication technique. With one suitable approach, a photoresist pattern is formed on top of the polysilicon layer 26 prior to silicide layer deposition. A top view of an illustrative fuse 12 that is being fabricated using this approach is shown in FIG. 11. The top view of FIG. 11 shows fuse 12 after polysilicon layer 26 has been deposited and patterned and after a photoresist layer 112 has been patterned on top of the polysilicon 26, but before silicide layer 28 has been deposited. Silicide layer 28 may be deposited on top of the photoresist 112. The photoresist may then be removed to lift off a notched portion of silicide 28 in overlap region 114. Using this type of lift-off technique is merely one suitable approach for patterning silicide 28 to form a narrowed silicide region on link 22. Any suitable fabrication technique may be used if desired.

Figure 12:
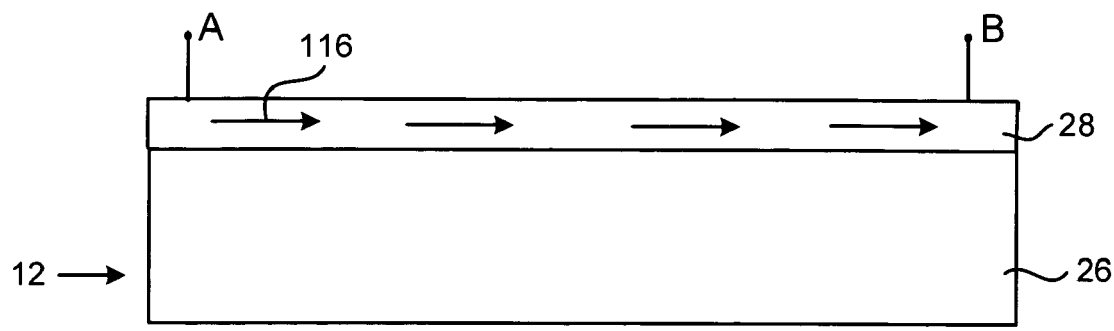
FIG. 12 is a cross-sectional side view of an unprogrammed electrically-programmable silicided polysilicon fuse that does not have a polysilicon p-n junction in accordance with the present invention.

The use of a p-n junction within the polysilicon 26 of fuse 12 may enhance the ability of sensing circuitry 20 to determine the state of the fuse 12 (i.e., whether the fuse is programmed or unprogrammed). A side view of an illustrative unprogrammed fuse 12 (with or without a p-n junction) is shown in FIG. 12. Current 116 from sensing circuitry 20 that is applied to fuse 12 through terminals A and B flows primarily through silicide layer 28, rather than polysilicon layer 26, due to the lower resistance of the silicide compared to that of the polysilicon. The silicide generally behaves ohmically—i.e., the resistance of the silicide is the same whether measured in the forward or reverse directions. Moreover, the total resistance of the fuse is relatively low in the unprogrammed condition, because the silicide layer 28 forms a highly-conductive path between terminals A and B.

Figure 13:
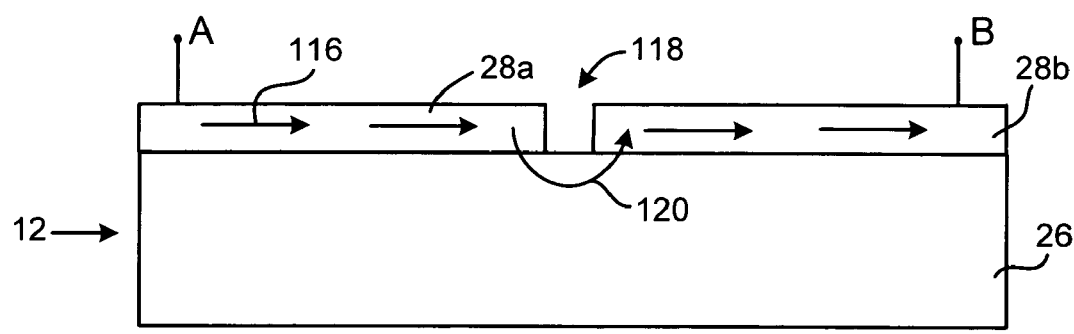
FIG. 13 is a cross-sectional side view of the electrically-programmable silicided polysilicon fuse of FIG. 12 following fuse programming in accordance with the present invention.
Figure 14:
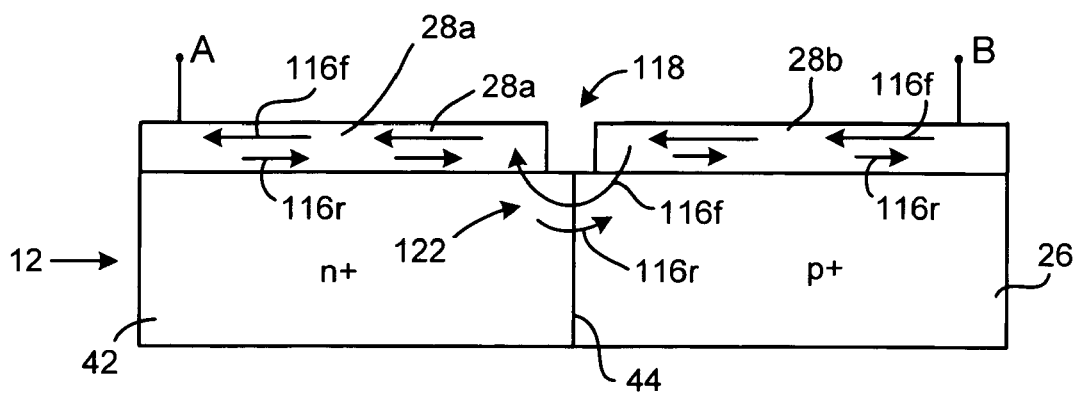
FIG. 14 is a cross-sectional side view of a programmed electrically-programmable silicided polysilicon fuse having a polysilicon p-n junction in accordance with the present invention.

After a sufficiently high programming current is applied to the silicide by fuse programming circuitry 16 (FIG. 1), a portion of the silicide forms an open circuit. A programmed fuse 12 that does not have a p-n junction is shown in FIG. 13. FIG. 14 shows a programmed fuse with a p-n junction. In the illustrative arrangements of FIGS. 13 and 14, the open-circuited portion of silicide layer 28 that results from the application of the programming current is represented schematically by a gap 118.

The position at which the programming current creates the open circuit portion 118 in the silicide may be controlled using a current-crowding structure such as a bend (e.g., a bend such as bend 102 of FIG. 9), a notch (e.g., a notch such as notch 36 of FIG. 2) or other silicide-narrowing structure, or other suitable current-crowding structure and/or suitable heat sink structures (see, e.g., FIGS. 5–7).

In a programmed fuse 12 without a p-n junction, a trace current 116 flows through the conductive portion 28a of the silicide, through polysilicon 26 along path 120 (in parallel with the open-circuit portion of the silicide), and through conductive portion 28b of the silicide. The polysilicon is generally substantially less conductive than the silicide in this type of arrangement, so the resistance of the polysilicon along path 120 is significant. As a result, the resistance of the programmed fuse 12 of FIG. 13 that is measured between terminals A and B will be significantly higher than the resistance of the unprogrammed fuse 12 of FIG. 12. If the open-circuit region 118 in the silicide is sufficiently large, the conductive portions 28a and 28b of the silicide will be separated by a substantial non-conductive region and the resulting increase in the fuse resistance will be sufficient for the sensing circuitry 20 (FIG. 1) to detect reliably.

Additional sensitivity (and therefore enhanced reliability and/or lower required programming currents) can be achieved using a p-n junction in the polysilicon. An illustrative programmed fuse having a p-n junction 44 is shown in FIG. 14. Because of the rectifying nature of a p-n junction, the amount of current that flows through the p-n junction portion of the polysilicon layer 26 is much greater in the forward-biased direction (when the voltage of p-type region 40 is higher than the voltage of n-type region 42) than in the reverse-biased direction (when the voltage of p-type region 40 is less than the voltage of n-type region 42). This disparity between the forward and reverse characteristics of the polysilicon p-n junction can be detected by the sensing circuitry 20. Whenever the sensing circuit 20 detects a high ratio of forward current to reverse current through the fuse, the sensing circuit 20 can conclude that the silicide has been open circuited and that current is flowing through the underlying p-n junction.

As shown in FIG. 14, when a forward-bias voltage is applied to fuse 12 by applying a higher voltage to terminal B than to terminal A, a forward-bias current flows from silicide region 28b to silicide region 28a via a path 116f in a region 122 of the polysilicon under the open-circuit region 118. When a reverse-bias voltage of the same magnitude (for example) is applied to fuse 12 by applying a lower voltage to terminal B than to terminal A, a reverse-bias current flows from silicide region 28a to silicide region 28b via a path 116r in a region 122 of the polysilicon under the open-circuit region 118. Because the junction 44 is reverse biased (and because the possible shunt path formed by the open-circuit region 118 has a very high resistance), the current in the reverse-bias direction is essentially blocked (i.e., the magnitude of the current 116r is extremely small).

For a given magnitude of applied sensing voltage, the reverse-bias current 116r will be substantially lower than the forward-bias current 116f due to the rectifying behavior of p-n junction 44. As a result, the ratio of the forward-bias current 116f to the reverse-bias current 116r will be high. The sensing circuitry 20 can measure current 116f and 116r and can determine the ratio of these two currents. If fuse 12 is unprogrammed, the electrical characteristics of the fuse will be dominated by the ohmic (non-rectifying) character of the silicide. Accordingly, when the measured ratio of current 116f to current 116r is low (e.g., unity or near unity), the sensing circuit can conclude that the fuse 12 is conducting current through an unprogrammed silicide layer 28 (i.e., it is behaving ohmically, as shown in FIGS. 16a and 16b). When the ratio is high, the sensing circuitry 20 can conclude that the fuse 12 is behaving non-ohmically (e.g., as a rectifying diode, as shown in FIGS. 15a and 15b) and has therefore been programmed.

Figure 15A:
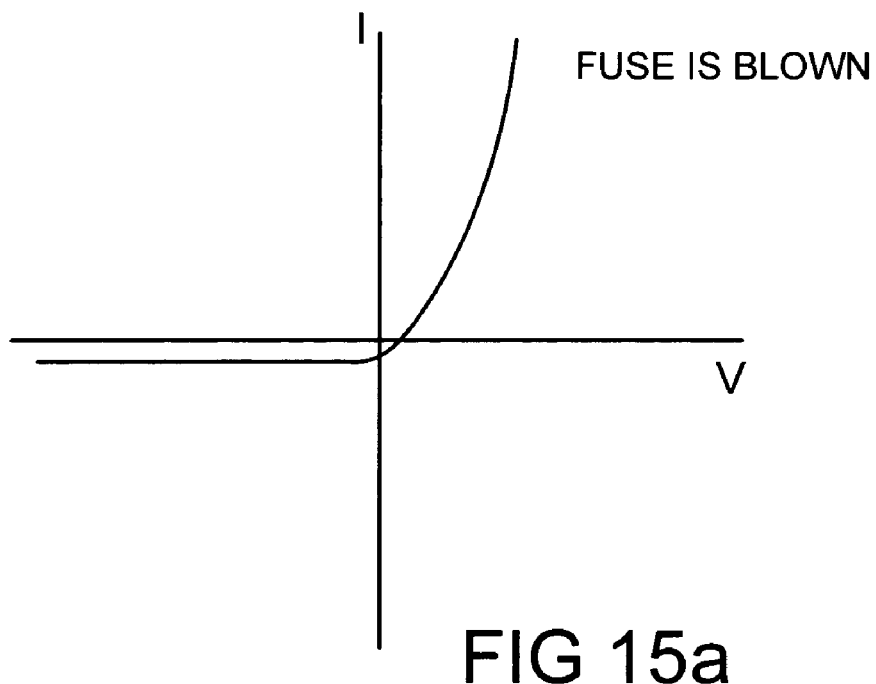
FIG. 15a is a graph showing the current-voltage relationship of a programmed silicided polysilicon fuse with a p-n polysilicon junction in accordance with the present invention.
Figure 15B:
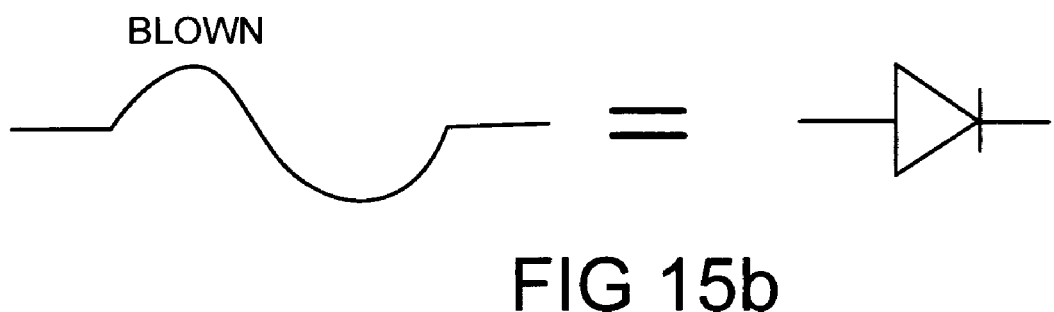
FIG. 15b is a schematic diagram showing how a blown fuse acts as a diode in accordance with the present invention.
Figure 16A:
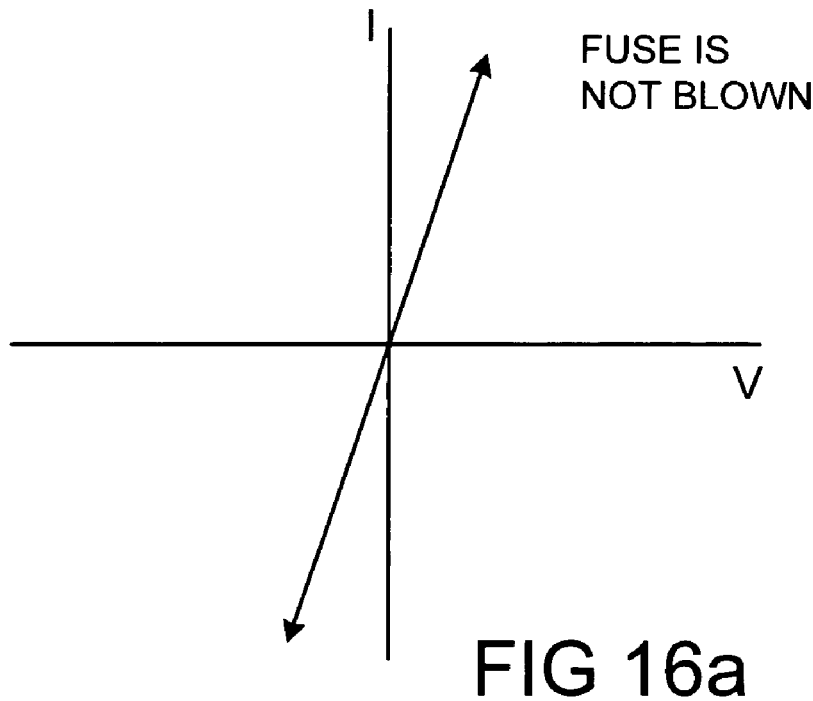
FIG. 16a is a graph showing the current-voltage relationship of an unprogrammed silicided polysilicon fuse with a p-n polysilicon junction in accordance with the present invention.
Figure 16B:
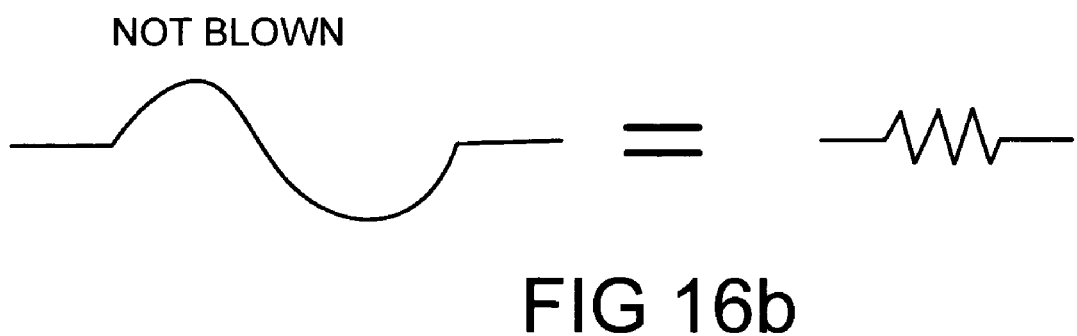
FIG. 16b is a schematic diagram showing how a fuse that is not blown acts as a resistor in accordance with the present invention.

If desired, the sensing circuitry 20 can perform a series of measurements at different forward-bias and reverse-bias voltages to determine the shapes of the curves of FIGS. 15a and 16a. The sensing circuitry 20 can also make a single forward-bias measurement and a single reverse-bias measurement. These are merely illustrative approaches for measuring the characteristics of fuse 12 to determine whether fuse 12 has been programmed. Any suitable approach may be used if desired.

Figure 17:
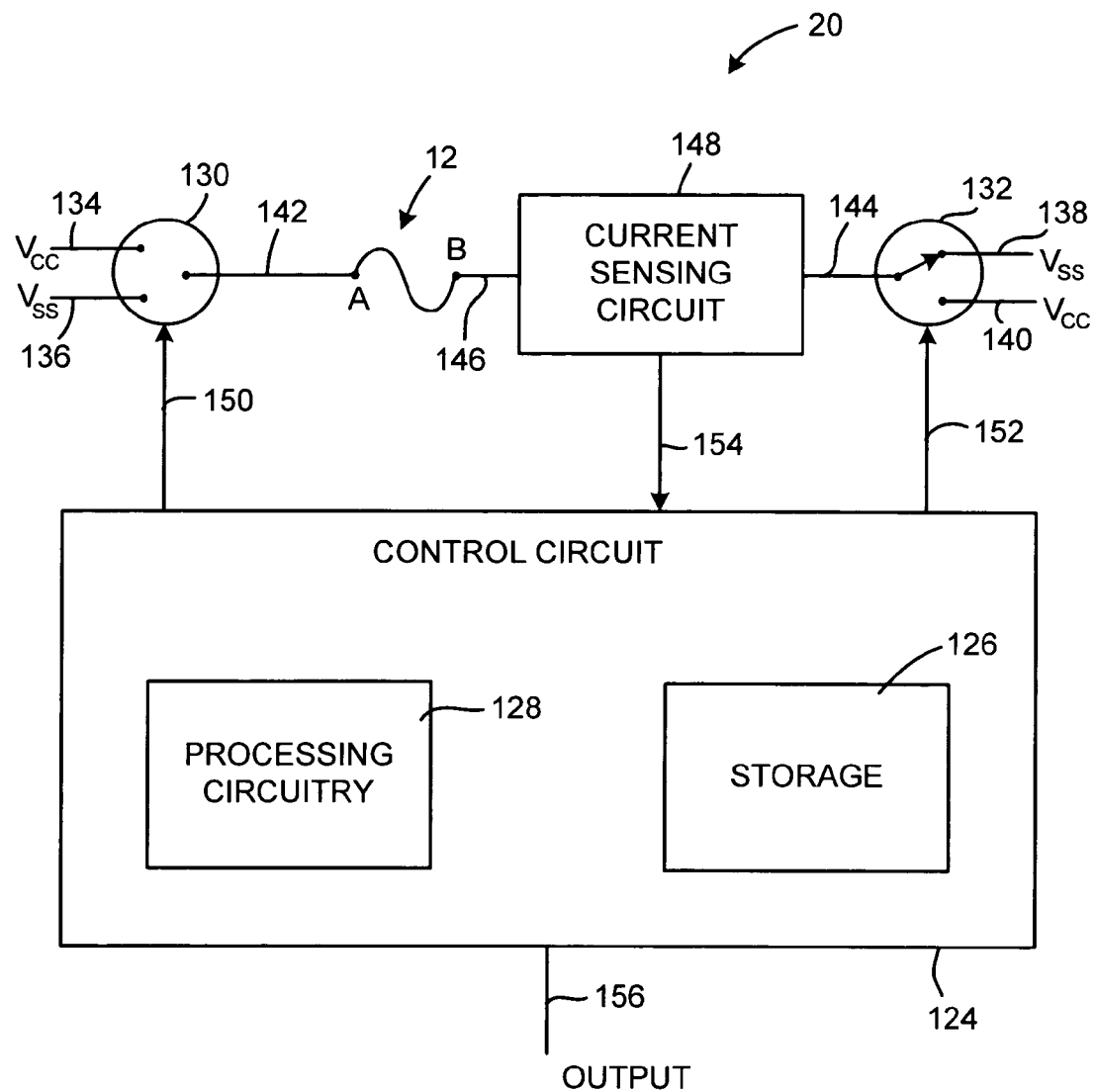
FIG. 17 is a diagram of illustrative sensing circuitry that may be used on an integrated circuit to sense the state of an electrically-programmable silicided polysilicon fuse in accordance with the present invention.

Illustrative sensing circuitry 20 that may be used to determine whether a given fuse 12 with a p-n junction 44 has been programmed is shown in FIG. 17. In the illustrative arrangement of FIG. 17, sensing circuitry 20 performs two measurements for each fuse 12. One measurement is made at a forward-bias voltage of $V_{cc}$-$V_{ss}$. Another measurement is made at a reverse-bias voltage of $V_{ss}$-$V_{cc}$.

Sensing circuitry 20 of FIG. 17 is based on a control circuit 124 with storage 126 and processing circuitry 128. Storage 126 may be formed from register logic or other suitable storage circuits on integrated circuit 10. Processing circuitry 128 may be formed from hard-wired circuitry that is dedicated to fuse-control operations or may include more general-purpose circuit resources. Using processing circuitry and storage 126, control circuit 124 can control sensing circuit components of the type shown in FIG. 17 and can produce corresponding output signals.

Sensing circuitry 20 may have switches such as switch 130 and 132 for controlling the signals applied to fuse 12 across terminals A and B. Switch 130 may receive voltage signals from suitable voltage sources at terminals 134 and 136. Switch 132 may receive voltage signals from voltage sources at terminals 138 and 140. In the example of FIG. 17, these voltages are fixed voltages at the power supply levels of Vcc (e.g., a positive voltage of 1–1.5 volts and Vss (e.g., a ground potential of 0 volts). Voltage sources of this type are generally available on most integrated circuits.

If the integrated circuit 10 on which sensing circuitry 20 is being used does not have such voltage source levels available, other voltages may be used to construct the forward-bias and reverse-bias voltages to apply to fuse 12. Moreover, a range of voltages levels may be applied to fuse 12 rather than just a single voltage level if desired. Using a range of voltage drops across the fuse 12 rather than applying a voltage of a single magnitude will enhance the ability of the sensing circuitry 20 to discriminate between the programmed and unprogrammed state of fuse 12.

The sensing circuitry 20 has a current sensing circuit 148, which measures current flowing through fuse 12. Current measurements from current sensing circuit 148 may be provided to control circuit 124 via path 154.

When it is desired to make forward-bias current measurements, control circuit 124 uses control lines 150 and 152 to send control signals to switches 130 and 132. These control signals direct switch 130 to connect terminal 136 of switch 130 to line 142 and direct switch 132 to connect terminal 140 to line 144. With the switches configured in this way, the voltage Vcc is applied to the fuse's p-type terminal B via line 144, current sensing circuit 148, and line 146 and the voltage Vss is applied to the fuse's n-type terminal A via line 142. Because the voltage at terminal B is higher than the voltage at terminal A, the p-n junction in the polysilicon layer 26 is forward biased.

Current sensing circuit 148 measures the current that flows through fuse 12 while fuse 12 is forward biased. Forward bias current measurements are provided to control circuit 124 by circuit 148 via path 154 and are stored by control circuit 124 in storage 126.

When it is desired to make reverse-bias current measurements, control circuit 124 uses control lines 150 and 152 to send control signals to switches 130 and 132 that reverse the states of these switches. In particular, the control signals direct switch 130 to connect terminal 134 of switch 130 to line 142 and direct switch 132 to connect terminal 138 to line 144. In this configuration, the voltage Vss is applied to the fuse's p-type terminal B via line 144, current sensing circuit 148, and line 146 and the voltage Vcc is applied to the fuse's n-type terminal A via line 142. Because the voltage at terminal B is lower than the voltage at terminal A, the p-n junction in the polysilicon layer 26 is reverse biased.

Current sensing circuit 148 measures the current that flows through fuse 12 while fuse 12 is reverse biased. The reverse bias measurements are provided to control circuit 124 via path 154 and are stored by control circuit 124 in storage 126.

With the arrangement of FIG. 17, control circuit 124 can obtain both forward-bias and reverse-bias resistance measurements for the fuse 12 (e.g., using current measurements from current sensing circuit 148 corresponding to the known values of voltage applied using switches 130 and 132). Control circuit 124 can uses these resistance measurements (or other comparable measurements such as raw current measurements, conductivity measurements, or other measurements indicative of the behavior of fuse 12) to determine whether the fuse 12 has been programmed or remains in its original unprogrammed state. A corresponding output signal can be provided at an output such as output 156. As an example, output 156 may be taken to a logic high level when sensing circuitry 20 determines that the fuse has been programmed and may be taken to a low logic level when sensing circuitry 20 determines that the fuse is in its unprogrammed state.

Processing circuitry 128 may, for example, use the stored forward-bias and reverse-bias current measurements from storage 126 to compute the ratio of the forward-bias current to the reverse-bias current (or the ratio of the forward-bias resistance to the reverse-bias resistance). By computing this type of ratio (e.g., a resistance or current ratio), the control circuit 124 can determine whether the fuse 12 is acting ohmically, as expected for an unprogrammed fuse whose behavior is dominated by current conduction through silicide layer 28 or is acting in a rectifying manner as expected for a programmed fuse which is conducting its current through a p-n junction. Determining whether fuse 12 is acting ohmically or is rectifying by applying signals across terminals A and B of both positive and negative polarities can be a more sensitive approach for determining the state of fuse 12 than purely quantitative approaches in which the state of a fuse is determined using single-polarity measurements of resistance.

Figure 18:
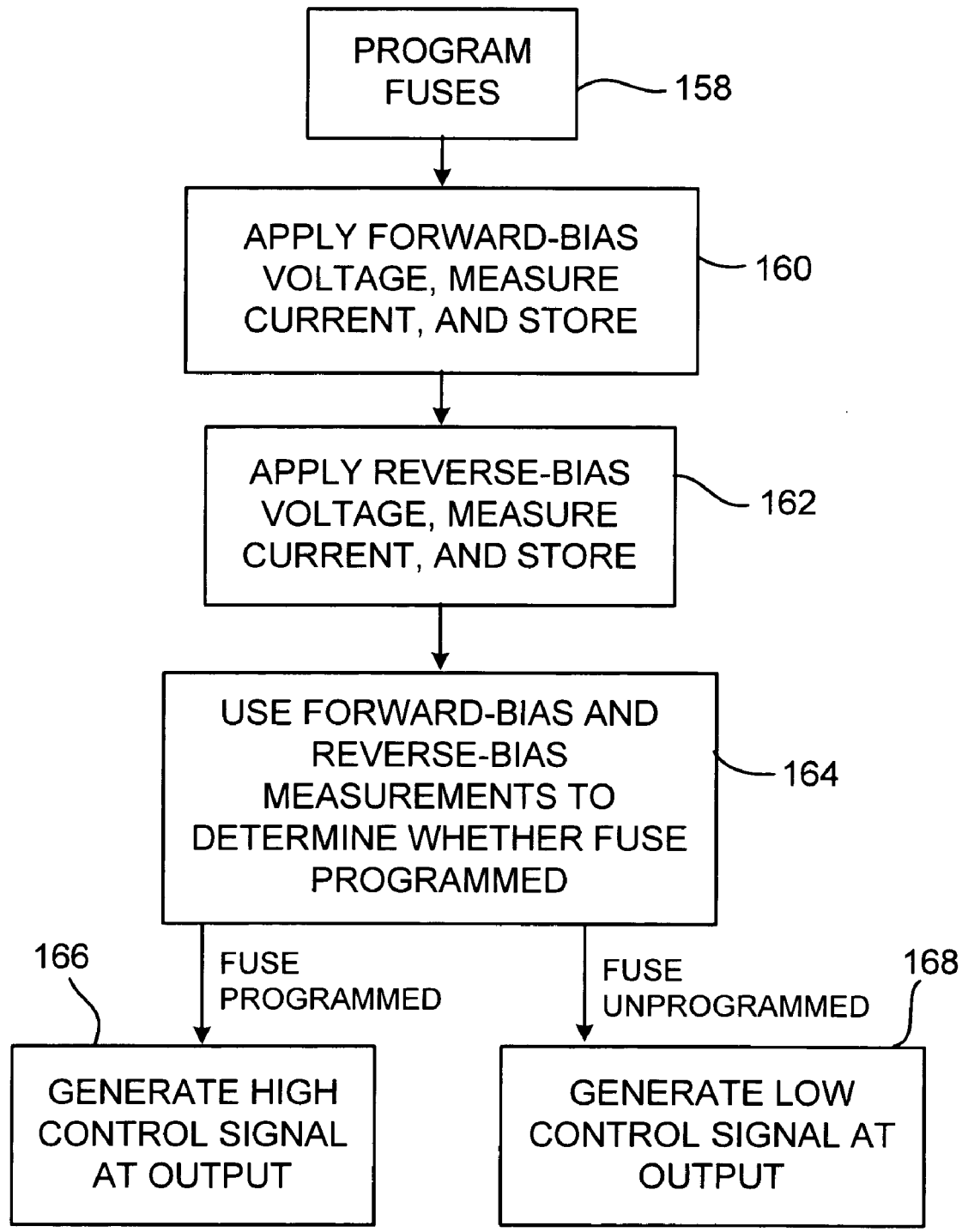
FIG. 18 is a flow chart of illustrative steps involved in programming and sensing electrically-programmable silicided polysilicon fuses with polysilicon p-n junctions in accordance with the present invention.

Illustrative steps involved in using a bidirectional (two-polarity) measurement scheme for determining the state of a fuse 12 having a polysilicon p-n junction 44 using sensing circuitry 20 (FIG. 1) are shown in FIG. 18.

At step 158, certain fuses 12 on integrated circuit 10 are programmed, while other fuses 12 are left unprogrammed. The fuses may be programmed using fuse programming circuitry 16 to apply programming currents to the appropriate fuses 12. The particular fuses 12 that are programmed may be dictated by programming data received from fuse programming equipment 14 over path 18. Fuses 12 may be programmed as part of an original manufacturing process (e.g., to permanently switch redundant circuitry on a memory device or programmable logic device into use before a part is shipped to a user) or may be programmed by an intermediate or end user (e.g., when fuses are being used as the programmable elements for controlling the programming of customizable logic circuits on a programmable logic device).

After the fuses 12 have been programmed and the integrated circuit 10 has been installed in a system, the integrated circuit 10 may be powered on. During this power-on process or at another suitable time, sensing circuitry 20 senses which fuses have been programmed and which have not and provides corresponding output signals to other portions of the circuit 10. In a typical scenario, the sensing circuit output signals are digital high and low signal (e.g., logic ones and zeros) on a digital circuit that turn on and off transistors on the circuit. These transistors are part of more complex circuitry such as look-up tables, multiplexers, pass gates, drivers, AND, NAND, OR and NOR logic gates, adjustable components such as adjustable resistors, etc. The circuitry that uses the sensing circuit output signals is shown as circuit components 21 of FIG. 1.

When fuses 12 contain p-n junctions, sensing circuitry 20 can use the p-n junction properties of the fuses 12 to help discriminate between programmed and unprogrammed fuses. At step 160, the sensing circuitry 20 can apply a forward bias to the fuses 12. The forward bias signals that are applied may, for example, be forward-bias voltages constructed from power supply voltage sources such as Vcc and Vss or may be other voltages (e.g., from charge-pump circuitry, voltage divider circuitry, adjustable voltage sources, etc.) A single forward-bias voltage may be applied or multiple forward-bias voltages may be applied for better discrimination.

While the forward-bias signals are being applied at step 160, sensing circuitry 20 may store corresponding forward-bias measurements (e.g., in storage 126). During forward-bias measurements, a voltage may be applied and the resulting current through each fuse 12 may be measured (e.g., using current sensing circuitry such as current sensing circuitry 148 of FIG. 17) or a current may be applied from a current source and the resulting voltage may be measured. Regardless of which of these arrangements is used, during step 160, the sensing circuitry 20 may maintain information on the forward-bias measurements that are made (e.g., using storage 126 of FIG. 17).

At step 162, sensing circuitry 20 makes reverse-bias measurements. For example, a reverse-bias voltage may be applied to each fuse and its corresponding current measured or a reverse-bias current may be applied to each fuse and its corresponding voltage may be measured. Multiple measurements may be made at different voltage and current levels for more accuracy. The sensing circuitry 20 may store information on the reverse-bias measurements that are made using storage such as storage 126 of FIG. 17.

At step 164, the sensing circuitry may use both the forward-bias measurements and the reverse-bias measurements to characterize the fuses 12 that have been measured. For each fuse that is measured, if the fuse has a dominantly ohmic current-voltage characteristic of the type shown in FIG. 16a, the sensing circuitry may produce a corresponding high output control signal for that fuse at step 166 (as an example). If the fuse has a dominantly rectifying current-voltage characteristic of the type shown in FIG. 15a, the sensing circuitry may produce a corresponding low output control signal at step 168 (as an example). The output signals from the sensed fuses may be provided by sensing circuitry 20 to circuit components 21 (FIG. 1). Once the circuit components 21 are being provided with appropriate signals from the sensed fuses 12, the integrated circuit 10 can be used for its normal operations.

If desired, sensing circuitry may generate error signals to indicate when certain fuses have been incompletely programmed. Error signals may be generated, for example, when the fuse measurements are not clearly indicative of the presence of a p-n junction (as expected when a fuse has been programmed) or the absence of p-n junction characteristics (as expected when a fuse is unprogrammed and the fuse should be acting ohmically). As an example, the expected ratio of forward-bias current to reverse-bias current through the fuse may be expected to be about $10^4$ for programmed fuses and about 1 for unprogrammed fuses. If the measured ratio of forward-bias current to reverse-bias current through the fuse is 500, which is indicative of a incompletely-programmed fuse, the sensing circuitry 20 can generate an error signal. When an error signal is produced, the circuit 10 may abort its power-up operation or other corrective actions may be taken.

Figure 19A:
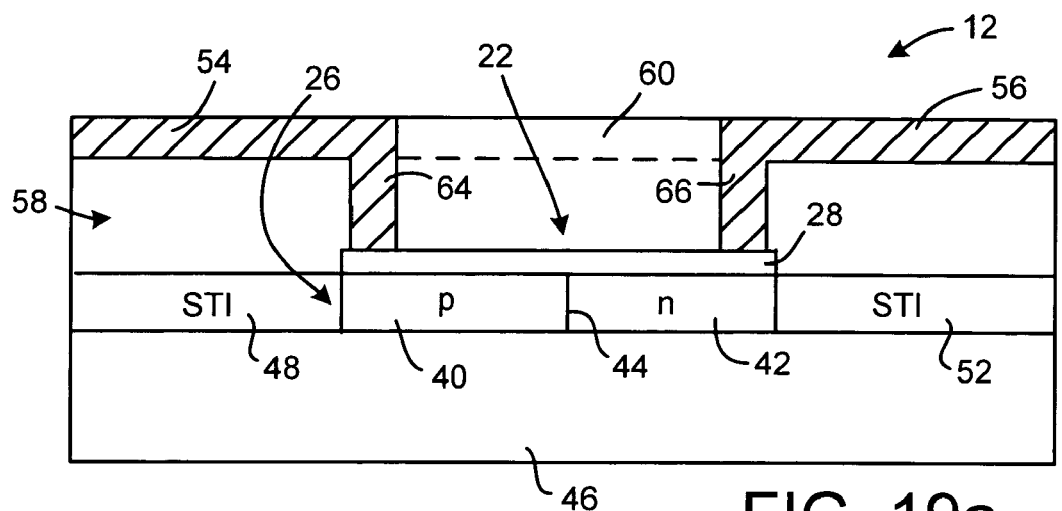
FIG. 19a is a top view of an illustrative fuse based on a crystalline silicon fuse link in accordance with the present invention.

If desired, the p-n junction in the fuse link 22 may be formed from crystalline silicon, rather than polysilicon. An illustrative fuse 12 having a crystalline-silicon-based fuse link 22 is shown in FIG. 19a. As shown in FIG. 19a, the semiconductor layer 26 in fuse link 22 may be formed from a p-type region 40 of crystalline silicon and an n-type region 42 of crystalline silicon. These regions form a p-n junction 44. Regions 40 and 42 may be formed using any suitable semiconductor fabrication technique (e.g., diffusion, implantation, etc.).

The crystalline silicon fuse 12 of FIG. 19a may be laterally isolated using shallow trench isolation (STI) regions such as region 48 and 52 (and comparable lateral-confinement regions located to the sides of regions 40 and 42). Shallow trench isolation is merely one illustrative technique for electrically isolating crystalline silicon fuse structures. Any suitable isolation technique (e.g., reverse-biased junctions, implanted insulators, etc.) may be used to isolate fuse 12 from its surroundings if desired.

Figure 19B:
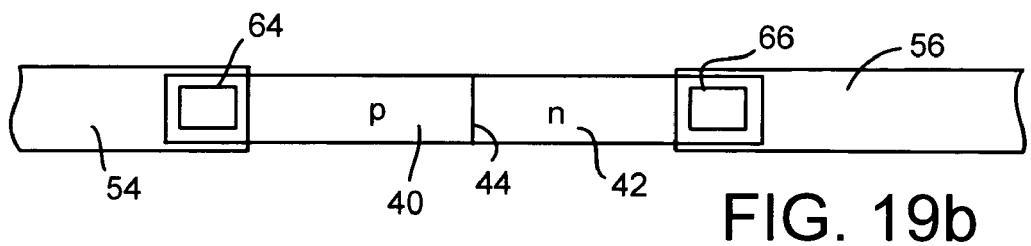
FIG. 19b is a side view of the illustrative fuse of FIG. 19b.

FIG. 19b shows a top view of the illustrative structure of FIG. 19a. In the fuse of FIGS. 19a and 19b, as with the other fuses 12 described herein, the top conductive layer 28 may be formed from silicide or any other suitable conducting thin film. Heat sink structures and silicide (or other conductive film) narrowing structure of other current crowding arrangements may be used with the fuses of the type shown in FIGS. 19a and 19b if desired.

With the arrangement of FIGS. 19a and 19b, vertical electrical confinement may be provided by using oppositely-doped wells or isolation regions. Vertical confinement may also be provided by using highly-resistive intrinsic silicon substrate 46.

Figure 20:
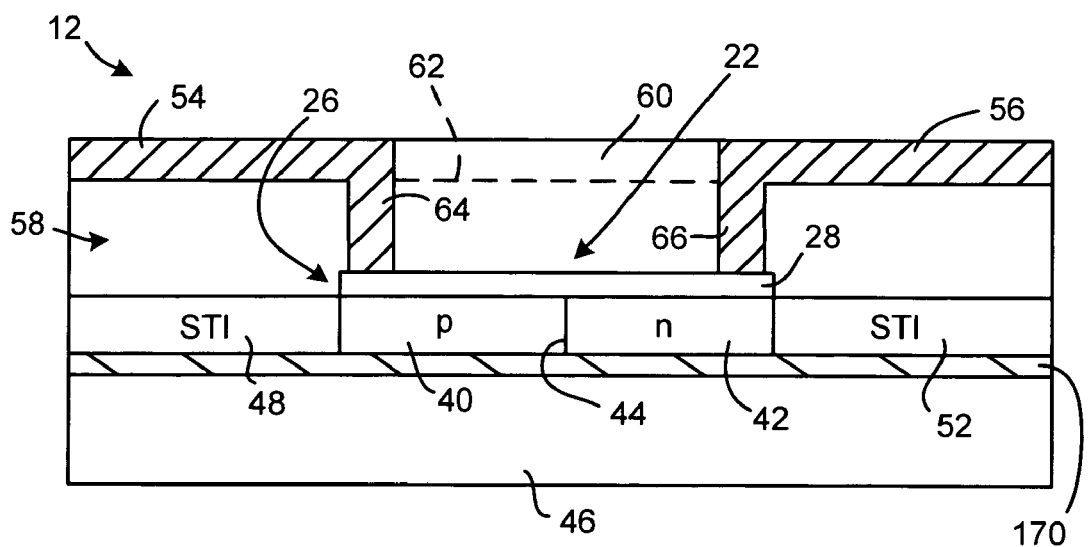
FIG. 20 is a side view of an illustrative silicon-on-insulator (SOI) integrated circuit substrate having a crystalline silicon fuse link in accordance with the present invention.

Another suitable approach for vertically isolating crystalline silicon fuses is shown in FIG. 20. With the arrangement of FIG. 20, the fuse 12 is formed on a silicon-on-insulator (SOI) substrate. The SOI substrate has a buried oxide layer 170. By forming the crystalline silicon regions 40 and 42 of the p-n junction fuse on the oxide layer 170, the fuse is electrically isolated in the vertical dimension. Lateral confinement may be provided using shallow trench isolation (as shown in FIG. 20) or any other suitable electrical isolation technique. Heat sinks and current crowding structures may be used with an SOI fuse of the type shown in FIG. 20 of desired.

The foregoing is merely illustrative of the principles of this invention and various modifications can be made by those skilled in the art without departing from the scope and spirit of the invention.

What is claimed is:

1. A fuse formed on an integrated circuit substrate, comprising:
   a fuse link that is programmed by applying a programming current; and
   at least one heat sink structure, wherein when the programming current is being applied, at least part of the at least one heat sink structure carries heat from the fuse link to the integrated circuit substrate without carrying current, wherein the at least one heat sink structure comprises two separate heat sinks located at respective ends of the fuse link.

2. The fuse defined in claim 1 wherein the fuse link comprises polysilicon.

3. The fuse defined in claim 1 wherein the fuse link comprises crystalline silicon.

4. The fuse defined in claim 1 wherein the fuse link comprises crystalline silicon having a p-n junction.

5. The fuse defined in claim 1 wherein the fuse link comprises crystalline silicon having a silicide coating and having a p-n junction.

6. The fuse defined in claim 1 wherein the fuse link comprises polysilicon covered with a layer of material having a lower resistivity than the polysilicon.

7. The fuse defined in claim 1 wherein the fuse link comprises:
   polysilicon; and
   a layer of silicide on top of the polysilicon.

8. The fuse defined in claim 1 wherein the fuse link comprises a silicided polysilicon link and wherein the at least one heat sink structure further comprises a heat sink at a middle position in the fuse link.

9. The fuse defined in claim 1 wherein the at least one heat sink structure comprises metal that conveys heat from the fuse to the substrate without conducting current.

10. The fuse defined in claim 1 wherein the at least one heat sink structure comprises at least one metal-filled contact hole that conveys heat from the fuse to the substrate without conducting current.

11. The fuse defined in claim 1 wherein the integrated circuit substrate is covered with a dielectric layer having first and second openings and wherein the at least one heat sink structure comprises first and second metal contacts at either end of the fuse link that convey heat from the fuse link to the integrated circuit substrate through the first and second openings.

12. The fuse defined in claim 1 wherein the fuse link comprises polysilicon with a layer of silicide, wherein the layer of silicide has a current-crowding structure that crowds the programming current applied to the fuse link.

13. The fuse defined in claim 1 wherein the fuse link comprises polysilicon having a p-type region and an n-type region that form a p-n junction.

14. The fuse defined in claim 1 wherein the fuse link comprises polysilicon having a p-n junction and a silicide layer having a narrowed portion located at the p-n junction.

15. The fuse defined in claim 1 wherein the at least one heat sink structure helps to blow the fuse at a given position within the fuse link and wherein the fuse link comprises polysilicon having a p-n junction at the given position.

16. The fuse defined in claim 1 wherein the at least one heat sink structure helps to blow the fuse at a given position within the fuse link, wherein the fuse link comprises polysilicon having a p-n junction at the given position, and wherein the fuse further comprises a silicide layer on the polysilicon having a narrowed region that crowds the programming current in the silicide layer during programming.

17. A fuse formed on an integrated circuit substrate, comprising:
   a fuse link that is programmed by applying a programming current; and
   at least one heat sink structure, wherein when the programming current is being applied, at least part of the at least one heat sink structure carries heat from the fuse link to the integrated circuit substrate without carrying current, wherein the fuse link comprises polysilicon with a layer of silicide, wherein the layer of silicide has a notch that narrows the layer of silicide and crowds the programming current being applied to the fuse link during programming.

18. A fuse formed on an integrated circuit substrate, comprising:
   a fuse link that is programmed by applying a programming current; and
   at least one heat sink structure, wherein when the programming current is being applied, at least part of the at least one heat sink structure carries heat from the fuse link to the integrated circuit substrate without carrying current, wherein the fuse link comprises polysilicon with a layer of silicide and wherein the fuse link comprises a bend that crowds the programming current being applied to the fuse link during programming.

19. A fuse on an integrated circuit substrate comprising:
   a fuse link having a polysilicon line and a layer of silicide on the polysilicon line, wherein the fuse link has first and second ends;
   first and second metal lines that apply a programming current to the fuse link that flows from the first end of the fuse link to the second end of the fuse link and programs the fuse link by creating an open circuit in the silicide layer, wherein the polysilicon line comprises a p-type doped region and an n-type doped region that form a p-n junction; and
   a narrowing structure in the silicide layer that crowds the programming current and causes the silicide to form the open circuit in the vicinity of the narrowing structure.

20. The fuse defined in claim 19 wherein the first and second metal lines are connected to the first and second ends of the fuse link by metal-filled via holes.

21. The fuse defined in claim 19 wherein the first and second metal lines are connected to the integrated circuit substrate by metal-filed contact holes, so that heat that is generated when the programming current is applied to the fuse link is conveyed from the fuse link to the integrated circuit substrate through the metal-filled contact holes.

22. The fuse defined in claim 19 wherein the narrowing structure is located at the p-n junction so that after the fuse has been programmed current applied between the first and second metal lines passes through the p-n junction.

23. The fuse defined in claim 19 wherein the narrowing structure comprises a notch in the silicide layer that crowds the programming current and causes the silicide to form the open circuit in the vicinity of the notch.

24. A fuse on an integrated circuit substrate comprising:
   a fuse link having a polysilicon line and a layer of silicide on the polysilicon line, wherein the fuse link has first and second ends; and
   first and second metal lines that apply a programming current to the fuse link that flows from the first end of the fuse link to the second end of the fuse link and programs the fuse link by creating an open circuit in the silicide layer, wherein the polysilicon line comprises a p-type doped region and an n-type doped region that form a p-n junction, wherein the first and second metal lines are connected to the integrated circuit substrate by metal-filed contact holes, so that heat that is generated when the programming current is applied to the fuse link is conveyed from the fuse link to the integrated circuit substrate through the metal-filled contact holes, wherein the integrated circuit substrate has wells of a first doping type in a region of a second doping type that is different from the first doping type, wherein the wells are located where the first and second metal lines are connected to the substrate, and wherein the wells of the first doping type and the region of the second doping type form opposing diodes through the substrate between the first and second metal lines, so that current is not conveyed from the first metal line to the second metal line through the substrate.

25. A fuse on an integrated circuit substrate comprising:
a fuse link having a polysilicon line and a layer of silicide on the polysilicon line, wherein the fuse link has first and second ends;
first and second metal lines that apply a programming current to the fuse link that flows from the first end of the fuse link to the second end of the fuse link and programs the fuse link by creating an open circuit in the silicide layer, wherein the polysilicon line comprises a p-type doped region and an n-type doped region that form a p-n junction; and
a narrowing structure in the silicide layer that crowds the programming current and causes the silicide to form the open circuit in the vicinity of the narrowing structure, wherein the narrowing structure is located at the p-n junction so that after the fuse has been programmed current applied between the first and second metal lines passes through the p-n junction, wherein the first and second metal lines are connected to the integrated circuit substrate by metal-filed contact holes, so that heat that is generated when the programming current is applied to the fuse link is conveyed from the fuse link to the integrated circuit substrate through the metal-filled contact holes, wherein the integrated circuit substrate has wells of a first doping type in a region of a second doping type that is different from the first doping type, wherein the wells are located where the first and second metal lines are connected to the substrate, and wherein the wells of the first doping type and the region of the second doping type form opposing diodes through the substrate between the first and second metal lines, so that current is not conveyed from the first metal line to the second metal line through the substrate.

26. A fuse on an integrated circuit substrate comprising:
a fuse link having a semiconductor line and a thin-film conductive layer on the semiconductor line, wherein the fuse link has first and second ends; and
first and second metal lines that apply a programming current to the fuse link that flows from the first end of the fuse link to the second end of the fuse link and programs the fuse link by creating an open circuit in the thin-film conductive layer, wherein the semiconductor line comprises a p-type doped region and an n-type doped region that form a p-n junction, wherein the substrate comprises a silicon-on-insulator substrate having a buried oxide layer that is adjacent to the semiconductor line.

27. The fuse defined in claim 26 wherein the thin-film conductive layer comprises silicide.

* * * * *